United States Patent
Shang et al.

(10) Patent No.: US 12,277,910 B2
(45) Date of Patent: Apr. 15, 2025

(54) SHIFT REGISTER UNIT AND DRIVING METHOD THEREOF, GATE DRIVE CIRCUIT, AND DISPLAY DEVICE

(71) Applicant: BOE TECHNOLOGY GROUP CO., LTD., Beijing (CN)

(72) Inventors: Guangliang Shang, Beijing (CN); Libin Liu, Beijing (CN); Jiangnan Lu, Beijing (CN); Yu Feng, Beijing (CN); Xinshe Yin, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,133

(22) PCT Filed: May 31, 2021

(86) PCT No.: PCT/CN2021/097512
§ 371 (c)(1),
(2) Date: May 31, 2022

(87) PCT Pub. No.: WO2022/252092
PCT Pub. Date: Dec. 8, 2022

(65) Prior Publication Data
US 2024/0185937 A1 Jun. 6, 2024

(51) Int. Cl.
*G11C 19/00* (2006.01)
*G09G 3/3266* (2016.01)
(Continued)

(52) U.S. Cl.
CPC ......... *G09G 3/3266* (2013.01); *G09G 3/3674* (2013.01); *G11C 19/28* (2013.01);
(Continued)

(58) Field of Classification Search
CPC ............ G11C 9/28; G09G 2310/0286; G09G 3/3674; G09G 3/20
See application file for complete search history.

(56) References Cited

U.S. PATENT DOCUMENTS 10,453,386 B2 * 10/2019 Jang .................... G09G 3/3266
10,872,677 B2 12/2020 Hou et al.
(Continued)

FOREIGN PATENT DOCUMENTS

CN 109448629 A 3/2019
CN 111128080 A 5/2020
(Continued)

*Primary Examiner* — Tuan T Lam
(74) *Attorney, Agent, or Firm* — Raj S. Davé; Davé Law Group, LLC

(57) ABSTRACT

A shift register unit and a driving method thereof, a gate drive circuit, and a display device are disclosed. The shift register unit includes: an input circuit, a first control circuit, an output circuit, an output noise reduction circuit, and a reset circuit; wherein the input circuit is connected to an input terminal; the first control circuit is connected to the first node, a second node, and a first clock signal terminal; the output circuit is connected to an output terminal; the output noise reduction circuit is connected to the output terminal; and the reset circuit is connected to a total reset terminal and a first voltage terminal, wherein the total reset signal is an invalid level in a first operation stage, and the total reset signal includes at least one period of valid level in a second operation stage.

19 Claims, 16 Drawing Sheets

(51) Int. Cl.
*G09G 3/36* (2006.01)
*G11C 19/28* (2006.01)
*H10K 59/121* (2023.01)
*G09G 3/20* (2006.01)

(52) U.S. Cl.
CPC ..... *H10K 59/1213* (2023.02); *H10K 59/1216* (2023.02); *G09G 3/20* (2013.01); *G09G 2300/0408* (2013.01); *G09G 2300/0426* (2013.01); *G09G 2310/0281* (2013.01); *G09G 2310/0286* (2013.01); *G09G 2310/061* (2013.01); *G09G 2310/08* (2013.01)

(56) References Cited

U.S. PATENT DOCUMENTS

| | | | |
|---|---|---|---|
| 11,587,513 B2* | 2/2023 | In | G09G 3/3291 |
| 11,694,626 B2* | 7/2023 | In | G09G 3/3233 |
| | | | 345/76 |
| 2022/0028323 A1* | 1/2022 | In | G09G 3/2092 |
| 2022/0068212 A1 | 3/2022 | Yao et al. | |
| 2022/0310010 A1 | 9/2022 | Cheng et al. | |
| 2022/0392400 A1* | 12/2022 | In | G09G 3/32 |
| 2023/0282170 A1* | 9/2023 | Shang | G11C 19/28 |
| | | | 345/206 |
| 2024/0078977 A1* | 3/2024 | Wang | G09G 3/3266 |

FOREIGN PATENT DOCUMENTS

| | | | |
|---|---|---|---|
| CN | 111445862 A | 7/2020 | |
| CN | 111445866 A | 7/2020 | |
| CN | 111816691 A | 10/2020 | |
| JP | 2015092427 A | 5/2015 | |

\* cited by examiner

SHIFT REGISTER UNIT AND DRIVING METHOD THEREOF, GATE DRIVE CIRCUIT, AND DISPLAY DEVICE

CROSS-REFERENCE TO RELATED APPLICATIONS

The present application is the U.S. National Stage Entry of PCT/CN2021/097512, filed on May 31, 2021, the entire disclosure of which is incorporated herein by reference as part of the disclosure of this application.

TECHNICAL FIELD

Embodiments of the present disclosure relate to a shift register unit and a driving method thereof, a gate drive circuit, and a display device.

BACKGROUND

In the field of display technology, for example, a pixel array of a liquid crystal display panel or an Organic Light Emitting Diode (OLED) display panel usually includes a plurality of rows of gate scanning signal lines and a plurality of columns of data lines staggered with the plurality of gate scanning signal lines. The driving of the gate scanning signal lines may be achieved by a bound integrated driving circuit. In recent years, with the continuous improvement of the preparation process of amorphous silicon thin film transistors or oxide thin film transistors, the driving circuit of the gate scanning signal lines may also be directly integrated on the thin film transistor array substrate to form a GOA (Gate driver On Array), so as to drive the gate scanning signal lines. For example, a GOA including a plurality of cascaded shift register units may be used to provide on-off state voltage signals (scanning signals) for the plurality of rows of gate scanning signal lines of the pixel array, so that the plurality of rows of gate scanning signal lines are controlled to turn on sequentially, and at the same time, data signals are provided to pixel units of the corresponding rows in the pixel array by data lines, so as to form the grayscale voltage required for each grayscale of the display image in each pixel unit, thereby displaying an image.

SUMMARY

At least one embodiment of the present disclosure provides a shift register unit, comprising: an input circuit, a first control circuit, an output circuit, an output noise reduction circuit, and a reset circuit: wherein the input circuit is connected to an input terminal and is configured to control a level of a first node in response to an input signal input from the input terminal; the first control circuit is connected to the first node, a second node, and a first clock signal terminal, and is configured to control a level of the second node under control of the level of the first node and a first clock signal provided by the first clock signal terminal; the output circuit is connected to an output terminal and is configured to output an output signal from the output terminal under control of the level of the second node: the output noise reduction circuit is connected to the output terminal and is configured to reduce noise at the output terminal under control of the level of the first node; and the reset circuit is connected to a total reset terminal and a first voltage terminal and is configured to turn off the output noise reduction circuit in response to a total reset signal provided by the total reset terminal, wherein the total reset signal is an invalid level in a first operation stage, and the total reset signal comprises at least one period of valid level in a second operation stage.

For example, the shift register unit provided by at least one embodiment of the present disclosure further includes a second control circuit, wherein the second control circuit is connected to the first node, a third node and a second clock signal terminal, and is configured to control a level of the third node under control of the level of the first node and a second clock signal provided by the second clock signal terminal; and the output noise reduction circuit is further connected to the third node and is configured to output an invalid level of the output signal at the output terminal in response to the level of the third node.

For example, in the shift register unit provided by at least one embodiment of the present disclosure, the reset circuit is further connected to the third node and is configured to reset the third node in response to the total reset signal provided by the total rest signal terminal to turn off the output noise reduction circuit.

For example, in the shift register unit provided by at least one embodiment of the present disclosure, the second control circuit comprises a first sub-circuit; and the first sub-circuit is connected to the first node, the second clock signal terminal, and the third node, and the first sub-circuit is configured to control the level of the third node under control of the level of the first node.

For example, in the shift register unit provided by at least one embodiment of the present disclosure, the second control circuit further comprises a second sub-circuit: the second sub-circuit is connected to a second voltage terminal, the first node, and a first control node, and the second sub-circuit is configured to control a level of the first control node in response to a second voltage provided by the second voltage terminal; and the first sub-circuit is further connected to the first control node and is configured to control the level of the third node in response to the level of the first control node.

For example, the shift register unit provided by at least one embodiment of the present disclosure further includes a third control circuit, wherein the third control circuit is connected to the second node, a fourth node, and the second clock signal terminal, and is configured to control a level of the fourth node under control of the level of the second node and the second clock signal provided by the second clock signal terminal.

For example, in the shift register unit provided by at least one embodiment of the present disclosure, the third control circuit comprises a third sub-circuit and a fourth sub-circuit: the third sub-circuit is connected to the second clock signal terminal and a second control node, and the third sub-circuit is configured to control a level of the second control node under control of the level of the second node; and the fourth sub-circuit is connected to the second clock signal terminal, the second control node, and the fourth node, and the fourth sub-circuit is configured to control the level of the fourth node in response to the second clock signal provided by the second clock signal terminal.

For example, in the shift register unit provided by at least one embodiment of the present disclosure, the third control circuit further comprises a fifth sub-circuit, wherein the fifth sub-circuit is connected to a second voltage terminal, the second node, and a third control node, and is configured to control a level of the third control node in response to a second voltage of the second voltage terminal; and the third sub-circuit is further connected to the third control node and is configured to control the level of the second control node in response to the level of the third control node.

For example, in the shift register unit provided by at least one embodiment of the present disclosure, the second control circuit further comprises a sixth sub-circuit; and the sixth sub-circuit is connected to the second control node, the first voltage terminal, and the first sub-circuit, and the sixth sub-circuit is configured to control a level of the first control node to remain stable in response to the level of the second control node.

For example, the shift register unit provided by at least one embodiment of the present disclosure further includes a fourth control circuit, wherein the fourth control circuit is connected to the first node, the first voltage terminal, and the fourth node, and the fourth control circuit is configured to control the level of the fourth node in response to the level of the first node.

For example, the shift register unit provided by at least one embodiment of the present disclosure further includes a fifth control circuit, wherein the fifth control circuit is connected to the second control node, the third node, and the first voltage terminal, and the fifth control circuit is configured to control the level of the third node in response to the level of the second control node.

For example, the shift register unit provided by at least one embodiment of the present disclosure further includes a sixth control circuit, wherein the sixth control circuit is connected to the total reset terminal, the first voltage terminal, and the first node, and the sixth control circuit is configured to reset the first node under control of the total reset signal provided by the total reset terminal.

For example, in the shift register unit provided by at least one embodiment of the present disclosure, wherein the input circuit comprises an input transistor; and a gate electrode of the input transistor is connected to the first clock signal terminal to receive the first clock signal, a first electrode of the input transistor is connected to the input terminal to receive the input signal, and a second electrode of the input transistor is connected to the first node.

For example, in the shift register unit provided by at least one embodiment of the present disclosure, the reset circuit comprises a reset transistor; and a gate electrode of the reset transistor is connected to the total reset terminal to receive the total reset signal, a first electrode of the reset transistor is connected to the first voltage terminal to receive a first voltage, and a second electrode of the reset transistor is connected to the third node.

For example, in the shift register unit provided by at least one embodiment of the present disclosure, the output noise reduction circuit comprises an output noise reduction transistor; and a gate electrode of the output noise reduction transistor is connected to the third node, a first electrode of the output noise reduction transistor is connected to a second voltage terminal to receive a second voltage, and a second electrode of the output noise reduction transistor is connected to the output terminal.

For example, in the shift register unit provided by at least one embodiment of the present disclosure, the output noise reduction circuit further comprises an output noise reduction capacitor; and a first electrode of the output noise reduction capacitor is connected to the second voltage terminal to receive the second voltage, and the second electrode of the output noise reduction capacitor is connected to the third node.

For example, in the shift register unit provided by at least one embodiment of the present disclosure, the output circuit comprises an output transistor and an output capacitor; a gate electrode of the output transistor is connected to the fourth node, a first electrode of the output transistor is connected to the output terminal, and a second electrode of the output transistor is connected to the first voltage terminal to receive a first voltage; and a first electrode of the output capacitor is connected to the fourth node, and a second electrode of the output capacitor is connected to the first voltage terminal to receive the first voltage.

For example, in the shift register unit provided by at least one embodiment of the present disclosure, the first sub-circuit comprises a first control transistor, a second control transistor, and a first control capacitor; a gate electrode of the first control transistor is connected to the first control node, a first electrode of the first control transistor is connected to the second clock signal terminal to receive the second clock signal, and a second electrode of the first control transistor is connected to a first electrode of the first control capacitor; a second electrode of the first control capacitor is connected to the first control node; and a gate electrode and a first electrode of the second control transistor are connected to each other, and both are connected to the first control node, and a second electrode of the second control transistor is connected to the third node.

For example, in the shift register unit provided by at least one embodiment of the present disclosure, the second sub-circuit comprises a third control transistor; and a gate electrode of the third control transistor is connected to the second voltage terminal, a first electrode of the third control transistor is connected to the first node, and a second electrode of the third control transistor is connected to the first control node.

For example, in the shift register unit provided by at least one embodiment of the present disclosure, the sixth sub-circuit comprises a fourth control transistor; and a gate electrode of the fourth control transistor is connected to the second control node, a first electrode of the fourth control transistor is connected to the first voltage terminal to receive a first voltage, and a second electrode of the fourth control transistor is connected to the first electrode of the first control capacitor.

For example, in the shift register unit provided by at least one embodiment of the present disclosure, the sixth control circuit comprises a fifth control transistor; and a gate electrode of the fifth control transistor is connected to the total reset terminal to receive the total reset signal, a first electrode of the fifth control transistor is connected to the first voltage terminal to receive a first voltage, and a second electrode of the fifth control transistor is connected to the first node.

For example, in the shift register unit provided by at least one embodiment of the present disclosure, the first control circuit comprises a sixth control transistor and a seventh control transistor; a gate electrode of the sixth control transistor is connected to the first node, a first electrode of the sixth control transistor is connected to the first clock signal terminal to receive the first clock signal, and a second electrode of the sixth control transistor is connected to the second node; and a gate electrode of the seventh control transistor is connected to the first clock signal terminal to receive the first clock signal, a first electrode of the seventh control transistor is connected to the second voltage terminal to receive a second voltage, and a second electrode of the seventh control transistor is connected to the second node.

For example, in the shift register unit provided by at least one embodiment of the present disclosure, the third sub-circuit comprises an eighth control transistor and a third control capacitor, the fourth sub-circuit comprises a ninth control transistor, and the fifth sub-circuit comprises a tenth control transistor; a gate electrode of the tenth control transistor is connected to the second voltage terminal to receive the second voltage, a first electrode of the tenth control transistor is connected to the second node, and a second electrode of the tenth control transistor is connected to the third control node; a first electrode of the third control capacitor is connected to the third control node, and a second electrode of the third control capacitor is connected to the second control node; a gate electrode of the eighth control transistor is connected to the third control node, a first electrode of the eighth control transistor is connected to the second clock signal terminal to receive the second clock signal, and a second electrode of the eighth control transistor is connected to the second control node; and a gate electrode of the ninth control transistor is connected to the second clock signal terminal to receive the second clock signal, a first electrode of the ninth control transistor is connected to the second control node, and a second electrode of the ninth control transistor is connected to the fourth node.

For example, in the shift register unit provided by at least one embodiment of the present disclosure, the fourth control circuit comprises an eleventh control transistor; and a gate electrode of the eleventh control transistor is connected to the first node, a first electrode of the eleventh control transistor is connected to the fourth node, and the second electrode of the eleventh control transistor is connected to the first voltage terminal to receive a first voltage.

For example, in the shift register unit provided by at least one embodiment of the present disclosure, the fifth control circuit comprises a twelfth control transistor; and a gate electrode of the twelfth control transistor is connected to the second control node, a first electrode of the twelfth control transistor is connected to the third node, and a second electrode of the twelfth control transistor is connected to the first voltage terminal to receive a first voltage.

At least one embodiment of the present disclosure provides a gate drive circuit, and the gate drive circuit includes a plurality of cascaded shift register units according to any one embodiment of the present disclosure.

At least one embodiment of the present disclosure provides a driving method of the shift register unit according to any one embodiment of the present disclosure, the driving method includes a first operation stage and a second operation stage: wherein in the first operation stage, the driving method comprises a first sub-stage, a second sub-stage, and a third sub-stage: in the first sub-stage, controlling the level of the first node by the input circuit, in response to a valid level of the input signal input from the input terminal; controlling the level of the second node by the first control circuit, under control of the level of the first node and the first clock signal provided by the first clock signal terminal; in the second sub-stage, outputting the output signal at the output terminal by the output circuit, under control of the level of the second node: in the third sub-stage, reducing noise at the output terminal by the output noise reduction circuit, under control of the level of the first node: in the second operating stage, the driving method comprises at least one reset stage: in the at least one reset stage, applying the valid level of the total reset signal to the total reset terminal, and applying the invalid level of the first clock signal to the first clock signal terminal; and turning off the output noise reduction circuit by the reset circuit in response to the valid level of the total reset signal.

For example, in the driving method provided by at least one embodiment of the present disclosure, in a case where the shift register unit further comprises a second control circuit, wherein the second control circuit is connected to the first node, a third node and a second clock signal terminal, and the second control circuit is configured to control a level of the third node under control of the level of the first node and a second clock signal provided by the second clock signal terminal; and the output noise reduction circuit is further connected to the third node and is configured to output an invalid level of the output signal at the output terminal in response to the level of the third node: the reset stage further comprises; applying an invalid level of the second clock signal to the second clock signal terminal; and resetting the third node by the reset circuit in response to the valid level of the total reset signal, to turn off the output noise reduction circuit in response to the level of the third node.

At least one embodiment of the present disclosure provides a display device, the display device includes the gate drive circuit according to any one embodiment of the present disclosure.

BRIEF DESCRIPTION OF THE DRAWINGS

In order to clearly illustrate the technical solutions of the embodiments of the present disclosure, the drawings of the embodiments will be briefly described in the following: it is obvious that the described drawings are only related to some embodiments of the present disclosure and thus are not limitative to the present disclosure.

DETAILED DESCRIPTION

Figure 1:
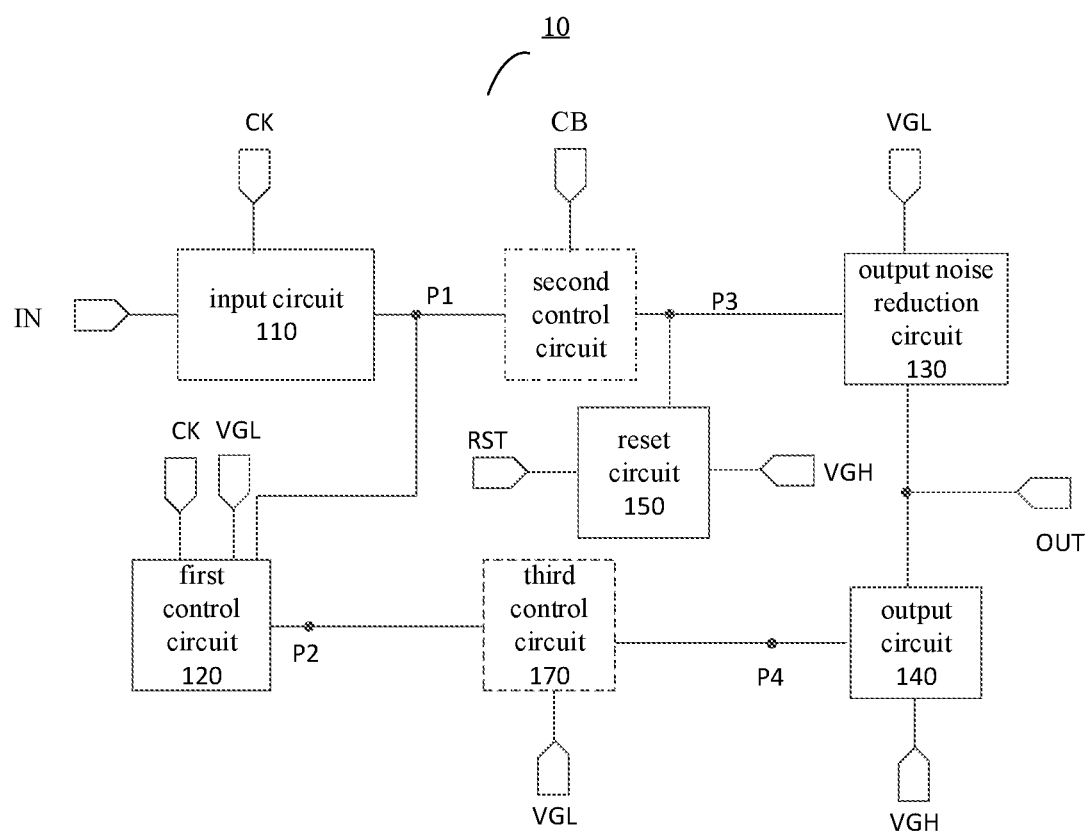
FIG. 1 is a schematic block diagram of a shift register unit provided by at least one embodiment of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the detailed description of some known functions and known components is omitted in this disclosure.

In order to keep the fluctuation of the pixel brightness within a reasonable range, data still needs to be refreshed in a case where the display screen is static, because the voltage controlling the pixel brightness changes with time because of the leakage of a transistor. In order to reduce the power consumption of the display panel, the refresh frequency of the display panel may be reduced. At the same time, in order to ensure that the display quality of the display panel is not affected, it is necessary to reduce the leakage speed of the transistor, and oxide semiconductor has the ultra-low leakage characteristic, which can meet this demand.

When a gate drive circuit driving a plurality of rows of sub-pixel units in a display panel, it is necessary to output a valid level of the gate scanning drive signal row by row in the display stage to drive the plurality of rows of sub-pixel units to emit light row by row. Further, to ensure the normal display of the display panel, in the blanking stage, it is necessary to turn on the reset transistors of each shift register unit in the gate drive circuit to reset the output terminal and reduce noise at the output terminal, thereby outputting the invalid level of the gate scanning signal in the blanking stage. However, in the blanking stage, especially in a case where the display panel is driven by low frequency, because the reset transistor is turned on continuously for a long time, it will affect the output reset and noise reduction ability, thus affecting the service life of the gate drive circuit.

At least one embodiment of the present disclosure provides a shift register unit. The shift register unit includes an input circuit, a first control circuit, an output circuit, an output noise reduction circuit, and a reset circuit. The input circuit is connected to an input terminal and is configured to control a level of a first node in response to an input signal input from the input terminal. The first control circuit is connected to the first node, a second node, and a first clock signal terminal, and is configured to control a level of the second node under control of the level of the first node and a first clock signal provided by the first clock signal terminal. The output circuit is connected to an output terminal and is configured to output an output signal at the output terminal under control of the level of the second node. The output noise reduction circuit is connected to the output terminal and is configured to reduce noise at the output terminal under control of the level of the first node. The reset circuit is connected to a total reset terminal and a first voltage terminal, and is configured to turn off the output noise reduction circuit in response to a total reset signal provided by the total reset terminal, and the total reset signal is an invalid level in the first operation stage and includes at least one period of valid level in the second operation stage.

Some embodiments of the present disclosure further provide a gate drive circuit, a display device, and a driving method corresponding to the above-mentioned shift register unit.

The shift register unit provided by embodiments of the present disclosure resets the output noise reduction circuit by the reset circuit in the second operation stage, so as to avoid affecting the output reset and noise reduction capability of the output noise reduction circuit due to the continuous conduction of the transistor in the output noise reduction circuit for a long time, so that the service life of the shift register unit can be prolonged and the display quality of the display panel can be improved.

In addition, in the embodiments of the present disclosure, for the sake of clarity and conciseness, the definition of "one frame". "each frame" or "a certain frame" includes the first operation stage and the second operation stage performed in sequence. For example, the first operation stage is a display stage, and the second operation stage is a blanking stage, which is not limited by embodiments of the present disclosure. The following description takes the first operation stage as the display stage and the second operation stage as the blanking stage as an example, which is not limited by the embodiments of the present disclosure. For example, during the display stage, the gate drive circuit outputs the valid level of the gate driving signal, and the valid level of the gate driving signal can drive a plurality of rows of sub-pixel units in the display panel to complete a scanning display of a complete image from the first row to the last row; and during the blanking stage, the gate drive circuit outputs an invalid level of the gate driving signal, so as to avoid the abnormal display of the panel.

Embodiments of the present disclosure and examples thereof are described in detail below in conjunction with the accompanying drawings.

FIG. 1 is a schematic block diagram of a shift register unit provided by at least one embodiment of the present disclosure. As shown in FIG. 1, in some examples, the shift register unit 10 may include an input circuit 110, a first control circuit 120, an output noise reduction circuit 130, an output circuit 140 and a reset circuit 150. A gate drive circuit may be obtained by cascading a plurality of shift register units 10, and the gate drive circuit is used for driving the display panel and providing scanning signals for a plurality of gate lines of the display panel in sequence, so that progressive scanning or interlaced scanning is performed when the display panel displays a frame of picture.

For example, as shown in FIG. 1, the input circuit 110 is connected to an input terminal IN and is configured to control a level of a first node P1 in response to an input signal input from the input terminal IN. For example, in some examples, the input circuit 110 is connected to the input terminal IN, a first clock signal terminal CK and a first node P1, and is configured to be turned on under control of the first clock signal provided by the first clock signal terminal CK, so that the input terminal IN and the first node P1 are connected, and therefore the input signal provided by the input terminal IN is input to the first node P1, and the potential of the first node P1 is charged to the working potential (e.g., the potential that may turn on the transistor connected to the first node P1). For example, in other examples, the input circuit 110 may be connected to the input terminal IN and the first node P1, and is configured to be turned on under control of the input signal provided by the input terminal IN, so that the input terminal IN is connected to the first node P1, and therefore the input signal provided by the input terminal IN is input to the first node P1, and the potential of the first node P1 is pulled up to the working potential. It should be noted that, as long as it is satisfied that the first node P1 may be charged in a corresponding stage, which is not limited by the embodiments of the present disclosure.

For example, the first control circuit 120 is connected to the first node P1, a second node P2, and a first clock signal terminal CK, and is configured to control a level of the second node P2 under control of the level of the first node P1 and a first clock signal provided by the first clock signal terminal CK. For example, in some examples, the first control circuit 120 is connected to the first node P1, the second node P2, a second voltage terminal VGL, and the first clock signal terminal CK, and is configured to be turned on under control of the level of the first node P1 and the first clock signal provided by the clock signal terminal CK, so that the second node P2 is connected to the second voltage terminal VGL to receive a second voltage, or the second node P2 is connected to the first clock signal terminal CK to receive the first clock signal, thereby achieving the control of the level of the second node P2.

For example, the output circuit 140 is connected to an output terminal OUT and is configured to output an output signal at the output terminal OUT under control of the level of the second node P2. For example, in some examples, the output circuit 140 is connected to the output terminal OUT, a fourth node P4, and a first voltage terminal VGH, and is configured to be turned on under control of the level of the fourth node P4, so that the first voltage provided by the first voltage terminal VGH is output to the output terminal OUT as an output signal. The fourth node P4, for example, is connected to the second node P2 through a third control circuit 170, that is, the output circuit 140 is indirectly connected to the second node P2, that is, the output circuit 140 is indirectly controlled by the second node P2, so that the output circuit 140 may also be configured to be turned on under control of the level of the second node P2, so the first voltage provided by the first voltage terminal VGH is output to the output terminal OUT as an output signal.

It should be noted that, in embodiments of the present disclosure, "under control of the level of the second node" may present that the second node indirectly controls the output circuit, that is, whether the output circuit is turned on or off may be controlled by the level (e.g., the level of the fourth node P4) output by other circuits (e.g., the third control circuit) related to the second node, or may be controlled directly by the level of the second node P2, which is not limited by the embodiments of the present disclosure. The following embodiments are similar to this, and are not repeated here.

For example, the output noise reduction circuit 130 is connected to the output terminal OUT and is configured to reduce noise at the output terminal OUT under control of the level of the first node. For example, in some examples, the output noise reduction circuit 130 is connected to the second voltage terminal VGL, a third node P3, and the output terminal OUT, and is configured to be turned on under control of the level of the third node P3, so that the output terminal OUT is connected to the second voltage terminal VGL, and therefore the output terminal OUT may be pulled down (e.g., discharged) by the second voltage VGL to achieve noise reduction. The third node P3, for example, is connected to the first node P1 through the second control circuit 160. That is, the output noise reduction circuit 130 is indirectly connected to the first node P1, that is, the output noise reduction circuit 130 is indirectly controlled by the first node P1, so that the output noise reduction circuit 130 may also be configured to be turned on under control of the level of the first node P1, and therefore the second voltage provided by the second voltage terminal VGL is output to the output terminal OUT to achieve noise reduction.

The reset circuit 150 is connected to a total reset terminal RST and a first voltage terminal VGH, and is configured to turn off the output noise reduction circuit 130 in response to a total reset signal provided by the total reset terminal RST. For example, the total reset signal is an invalid level in the first operation stage and includes at least one period of a valid level (For example, a level that may turn on the transistor) in the second operation stage. For example, the reset circuit 150 is connected to the third node P3, the total reset terminal RST, and the first voltage terminal VGH, and is configured to connect the first voltage terminal VGH to the third node P3 in response to the total reset signal provided by the total reset terminal RST, so as to reset the third node P3, so that the output noise reduction circuit 130 is turned off in response to the level of the third node P3.

For example, in the second operation stage, that is, the blanking stage, the total reset signal includes at least one period of a valid level, so that the reset circuit 150 may be turned on in response to at least one period of the valid level of the total reset signal during the blanking stage, and the third node P3 is reset to the first voltage at least once, so that the output noise reduction circuit 130 is turned off at least once in response to the level of the third node P3. Therefore, the transistor included in the output noise reduction circuit 130 can be prevented from being continuously turned on for a long time in the blanking stage, so as to avoid affecting the performance of the transistor and the output reset and noise reduction capability of the output noise reduction circuit 130, thereby prolonging the service life of the circuit and ensuring the display quality of the display panel.

It should be noted that, in the first operation stage, that is, the display stage, the transistors in the output noise reduction circuit are not always turned on. For example, in the stage where the output circuit outputs the output signal in the display stage, the output noise reduction circuit is turned off, and therefore the reset signal is an invalid level in the display stage, so that the normal operation of the shift register unit can be guaranteed.

For example, as shown in FIG. 1, the shift register unit 10 further includes a second control circuit 160. For example, the second control circuit 160 is connected to the first node P1, a third node P3 and a second clock signal terminal CB, and the second control circuit 160 is configured to control a level of the third node P3 under control of the level of the first node P1 and a second clock signal provided by the second clock signal terminal CB. For example, in some examples, the second control circuit 160 is connected to the first node P1, the third node P3, and the second clock signal terminal CB, and is configured to connect the third node P3 and the second clock signal terminal CB under control of the level of the first node P1, so as to provide the second clock signal provided by the second clock signal terminal CB to the third node P3, thereby controlling of the level of the third node P3.

For example, in the example, the output noise reduction circuit 130 is further connected to the third node P3 and is configured to output an invalid level (for example, a level turning off a transistor) of the output signal at the output terminal OUT in response to the level of the third node P3. For example, the reset circuit is further connected to the third node P3, and is configured to reset the third node P3 in response to the total reset signal provided by the total reset terminal RST, so that the output noise reduction circuit 130 is turned off. For a specific introduction, please refer to the above introduction about the output noise reduction circuit 130 and the reset circuit 150, which are not repeated here.

For example, as shown in FIG. 1, in some other examples, the shift register unit 10 further includes a third control circuit 170. The third control circuit 170 is connected to the second node P2, a fourth node P4, and the second clock signal terminal CB, and is configured to control a level of the fourth node P4 under control of the level of the second node P2 and the second clock signal provided by the second clock signal terminal CB. For example, in some examples, the third control circuit 170 is connected to the second node P2, a fourth node P4, and the second clock signal terminal CB, and is configured to connect the fourth node P4 to the second node P2 under control of the level of the second node P2 and the second clock signal provided by the second clock signal terminal, so that the level of the second node P2 is provided to the fourth node P4, thereby controlling the level of the fourth node P4.

Figure 2:
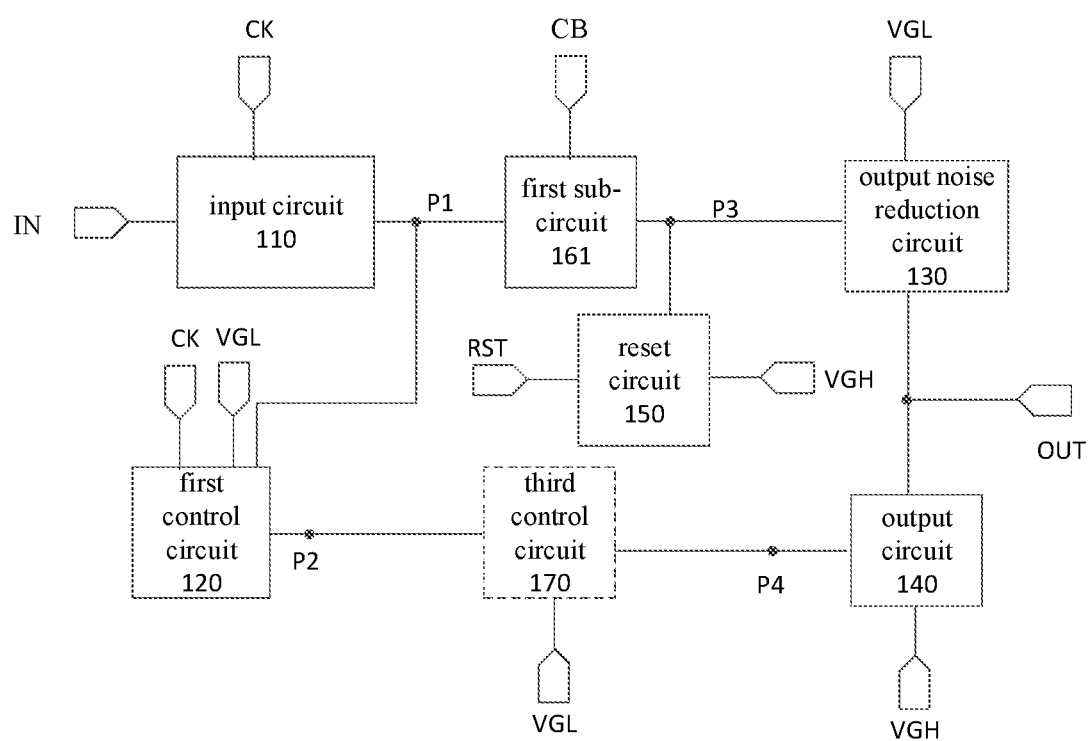
FIG. 2 is a schematic block diagram of another shift register unit provided by at least one embodiment of the present disclosure.

FIG. 2 is a schematic block diagram of another shift register unit provided by at least one embodiment of the present disclosure. For example, as shown in FIG. 2, the second control circuit 160 includes a first sub-circuit 161. For example, the first sub-circuit 161 is connected to the first node P1, the second clock signal terminal CB, and the third node P3, and is configured to control the level of the third node P3 under control of the level of the first node P1. For example, in some examples, the first sub-circuit 161 is connected to the first node P1, the second clock signal terminal CB, and the third node P3, and is configured to connect the second clock signal terminal CB to the third node P3 under control of the level of the first node P1, thereby controlling the level of the third node P3.

Figure 3:
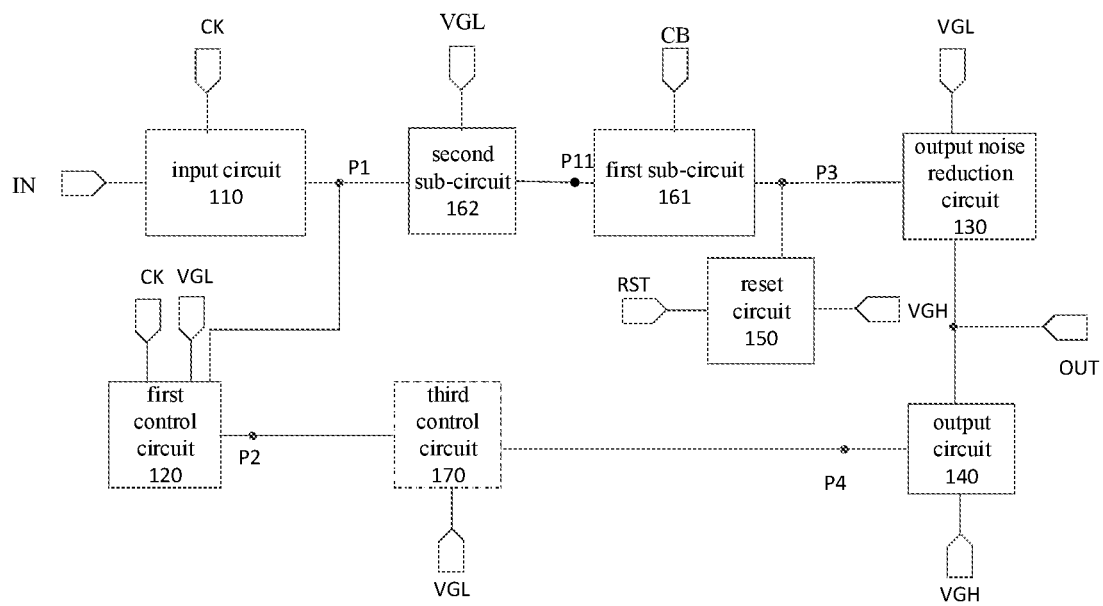
FIG. 3 is a schematic block diagram of another shift register unit provided by at least one embodiment of the present disclosure.

FIG. 3 is a schematic block diagram of another shift register unit provided by at least one embodiment of the present disclosure. For example, as shown in FIG. 3, the second control circuit 160 further includes a second sub-circuit 162. The second sub-circuit 162 is connected to a second voltage terminal VGL, the first node P1, and a first control node P11, and is configured to control a level of the first control node P11 in response to a second voltage provided by the second voltage terminal VGL. The first sub-circuit 161 is further connected to the first control node P11 and is configured to control the level of the third node P3 in response to the level of the first control node P11. For example, in some examples, the second sub-circuit 162 is turned on in response to the second voltage provided by the second voltage terminal VGL, so that the first node P1 and the first control node P11 are connected, and therefore the level of the first control node P11 is the same as the level of the first node P1. In this example, the first sub-circuit 161 is turned on in response to the level of the first control node P11, so that the second clock signal terminal CB is connected to the third node P3, thereby controlling the level of the third node P3.

Figure 4:
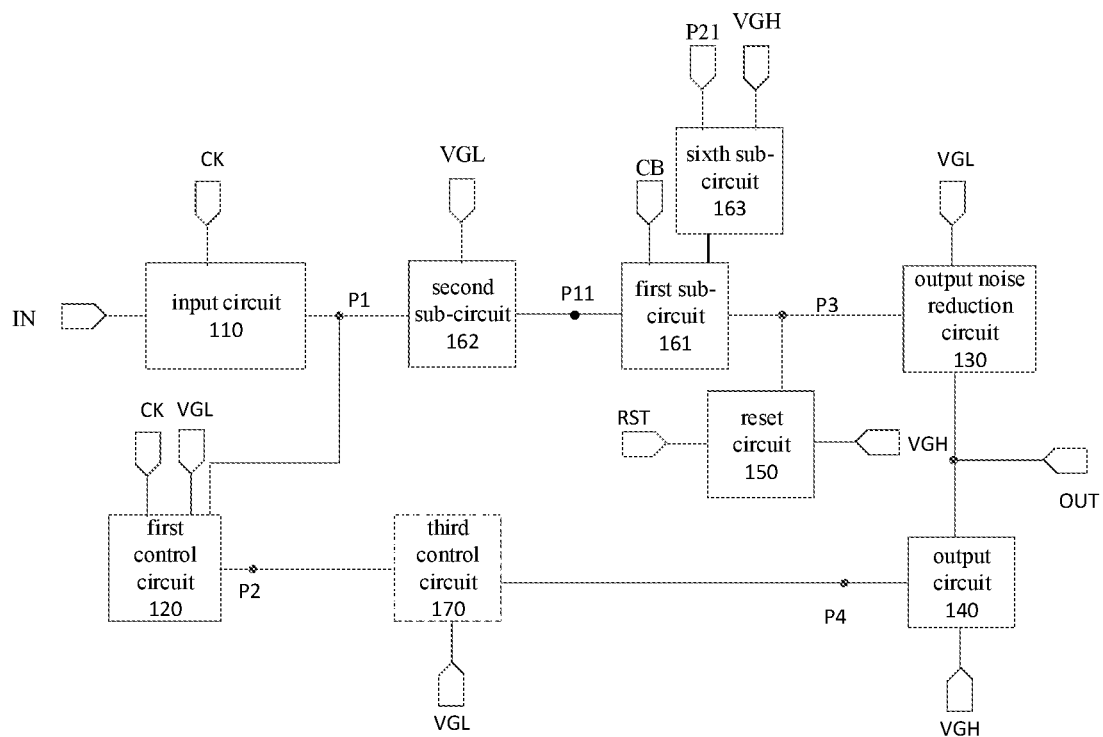
FIG. 4 is a schematic block diagram of another shift register unit provided by at least one embodiment of the present disclosure.

FIG. 4 is a schematic block diagram of another shift register unit provided by at least one embodiment of the present disclosure. For example, as shown in FIG. 4, the second control circuit 160 further includes a sixth sub-circuit 163. For example, the sixth sub-circuit 163 is connected to the second control node P21, the first voltage terminal VGH, and the first sub-circuit 161, and is configured to control the level of the first control node P11 to remain stable in response to the level of the second control node P21. For example, in some examples, the sixth sub-circuit 163 is turned on in response to the level of the second control node P21, so that the first voltage terminal VGH is connected to the first sub-circuit 161, and therefore it can be avoided that the level of the first control node P11 is affected when the second clock signal provided by the second clock signal terminal CB connected to the first sub-circuit 161 changes, thereby avoiding affecting the normal operation of the shift register unit.

Figure 5:
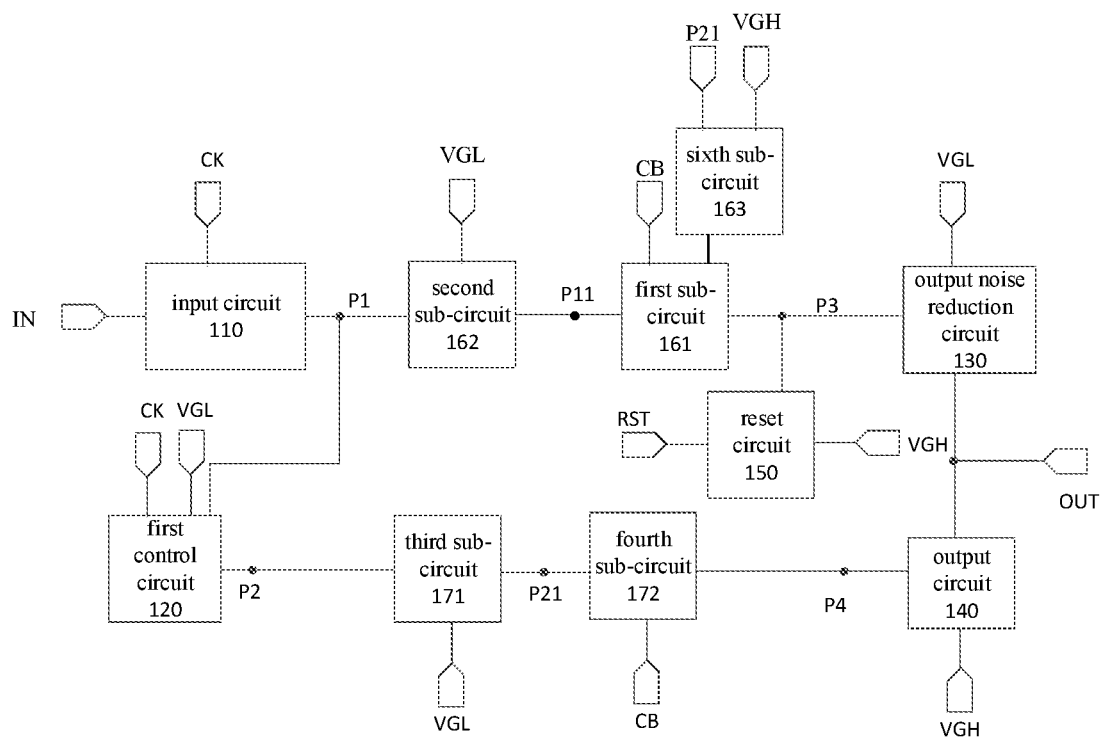
FIG. 5 is a schematic block diagram of another shift register unit provided by at least one embodiment of the present disclosure.

FIG. 5 is a schematic block diagram of another shift register unit provided by at least one embodiment of the present disclosure. For example, as shown in FIG. 5, the third control circuit includes a third sub-circuit 171 and a fourth sub-circuit 172. The third sub-circuit 171 is connected to the second clock signal terminal CB and a second control node P21, and is configured to control a level of the second control node P21 under control of the level of the second node P2. The fourth sub-circuit 172 is connected to the second clock signal terminal CB, the second control node P21, and the fourth node P4, and is configured to control the level of the fourth node P4 in response to the second clock signal provided by the second clock signal terminal CB. For example, in some examples, the third sub-circuit 171 is turned on under control of the level of the second node P2, so that the second clock signal terminal CB is connected to the second control node P21, thereby providing the second clock signal provided by the second clock signal terminal CB to the second control node P21, so as to control the level of the second control node P21. The fourth sub-circuit 172 is turned on in response to the second clock signal provided by the second clock signal terminal CB, so that the second control node P21 and the fourth node P4 are connected to input the level of the second control node P21 to the fourth node P4, so as to control the level of the fourth node P4.

Figure 6:
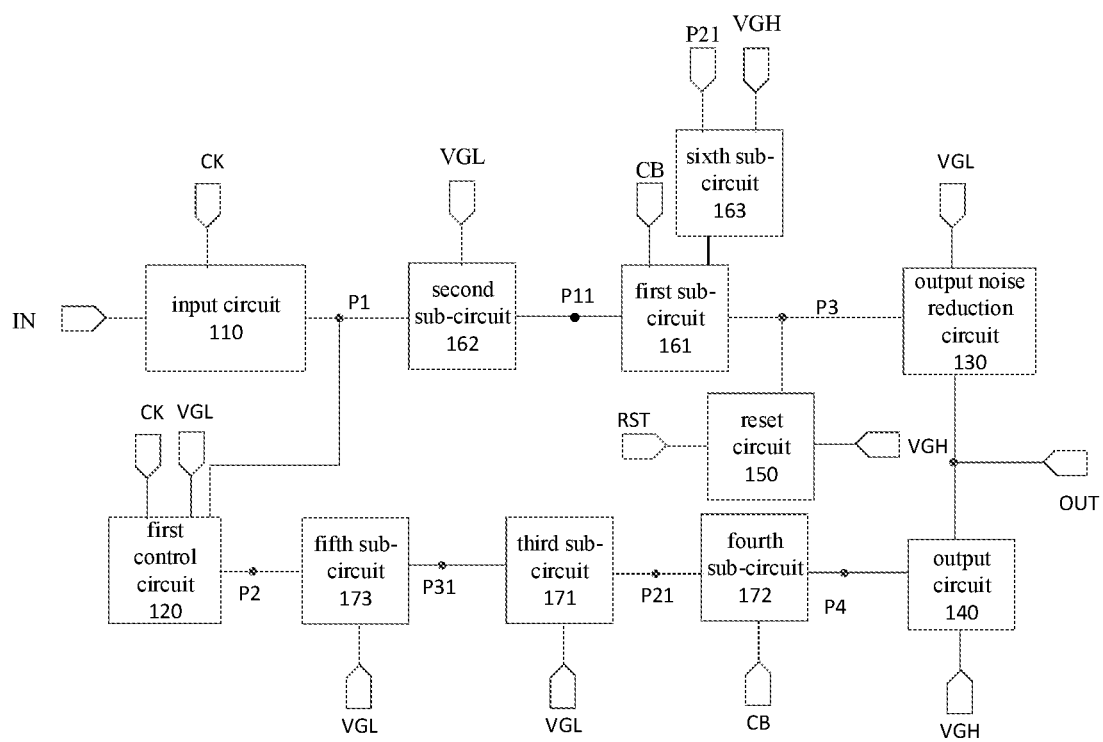
FIG. 6 is a schematic block diagram of another shift register unit provided by at least one embodiment of the present disclosure.

FIG. 6 is a schematic block diagram of another shift register unit provided by at least one embodiment of the present disclosure. For example, as shown in FIG. 6, the third control circuit 170 further includes a fifth sub-circuit 173. For example, the fifth sub-circuit 173 is connected to the second voltage terminal VGL, the second node P2, and a third control node P31, and is configured to control a level of the third control node P31 in response to the second voltage of the second voltage terminal VGL. The third sub-circuit 171 is further connected to the third control node P31 and is configured to control the level of the second control node P21 in response to the level of the third control node P31. For example, in some examples, the fifth sub-circuit 173 is turned on in response to the second voltage provided by the second voltage terminal VGL, and inputs the level of the second node P2 to the third control node P31 to control the level of the third control node P31. In this example, the third sub-circuit 171 is configured to be turned on in response to the level of the third control node P31, so that the second clock signal terminal CB is connected to the second control node P21, thereby providing the second clock signal provided by the second clock signal terminal CB to the second control node P21, so as to control the level of the second control node P21.

Figure 7:
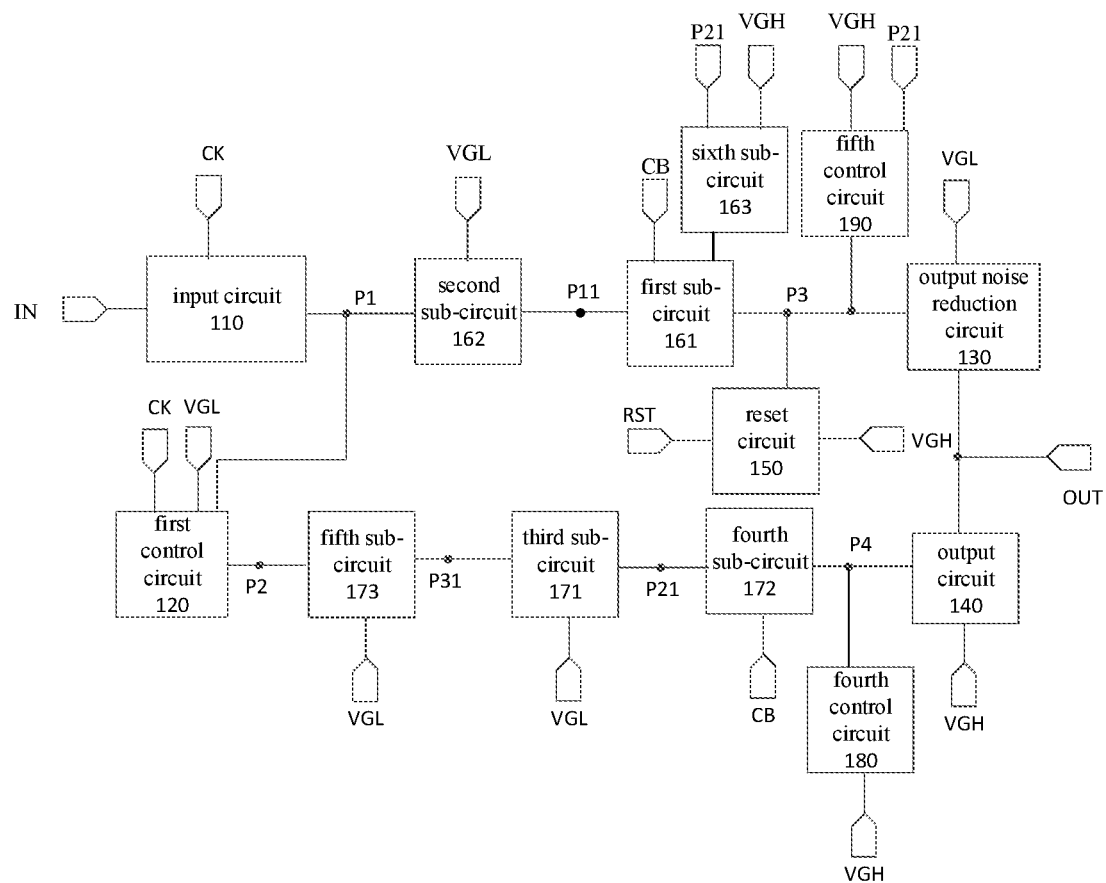
FIG. 7 is a schematic block diagram of another shift register unit provided by at least one embodiment of the present disclosure.

FIG. 7 is a schematic block diagram of another shift register unit provided by at least one embodiment of the present disclosure. For example, as shown in FIG. 7, on the basis of the example shown in FIG. 6, the shift register unit 10 further includes a fourth control circuit 180. For example, the fourth control circuit 180 is connected to the first node P1, the first voltage terminal VGH, and the fourth node P4, and is configured to control the level of the fourth node P4 in response to the level of the first node P1. For example, in some examples, the fourth control circuit 180 is turned on in response to the level of the first node P1, so that the first voltage terminal VGH is connected to the fourth node P4, so as to input the first voltage provided by the first voltage terminal VGH to the fourth node P4, thereby achieving controlling the level of the fourth node P4.

For example, as shown in FIG. 7, the shift register unit 10 further includes a fifth control circuit 190. For example, the fifth control circuit 190 is connected to the second control node P21, the third node P3, and the first voltage terminal VGH, and is configured to control the level of the third node P3 in response to the level of the second control node P21. For example, in some examples, the fifth control circuit 190 is configured to be turned on in response to the level of the second control node P21, so that the third node P3 is connected to the first voltage terminal VGH to receive the first voltage, so as to control the level of the third node P3.

Figure 8:
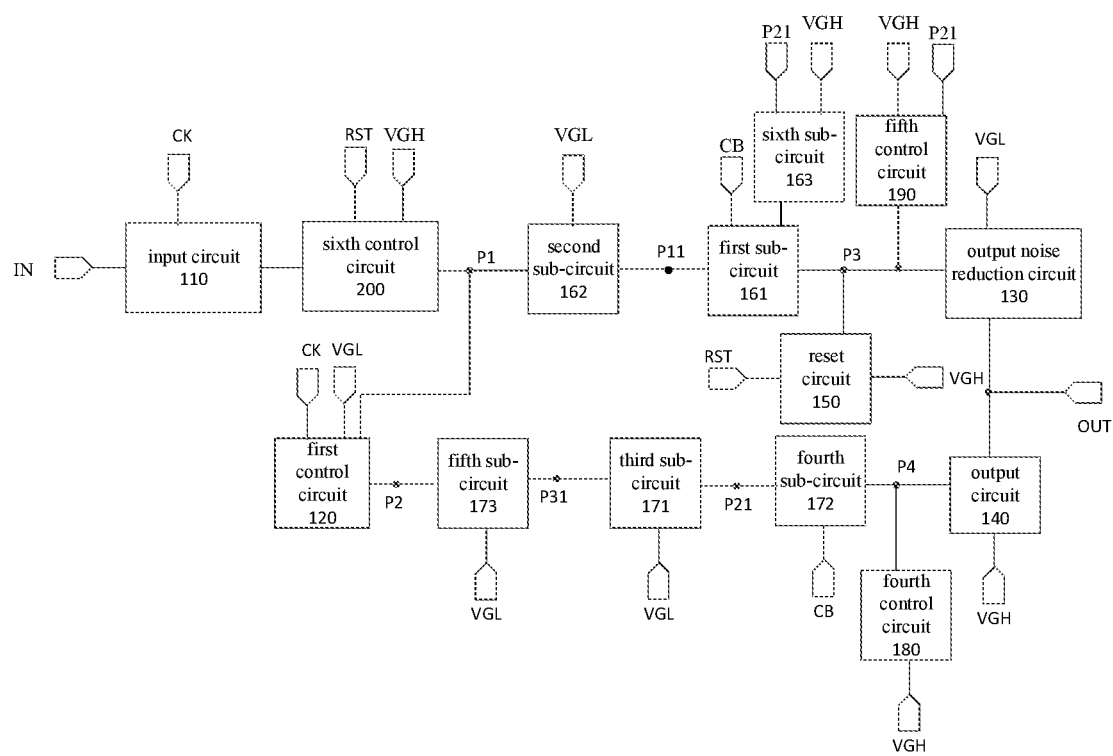
FIG. 8 is a schematic block diagram of another shift register unit provided by at least one embodiment of the present disclosure.

FIG. 8 is a schematic block diagram of another shift register unit provided by at least one embodiment of the present disclosure. For example, as shown in FIG. 8, on the basis of the example shown in FIG. 7, the shift register unit further includes a sixth control circuit 200. For example, the sixth control circuit 200 is connected to the total reset terminal RST, the first voltage terminal VGH, and the first node P1, and is configured to reset the first node P1 under control of a total reset signal provided by the total reset terminal RST. For example, in some examples, the sixth control circuit 200 is configured to be turned on in response to the total reset signal provided by the total reset terminal RST, so that the first node P1 is connected to the first voltage terminal VGH to receive the first voltage, thereby resetting the first node P1.

Figure 9:
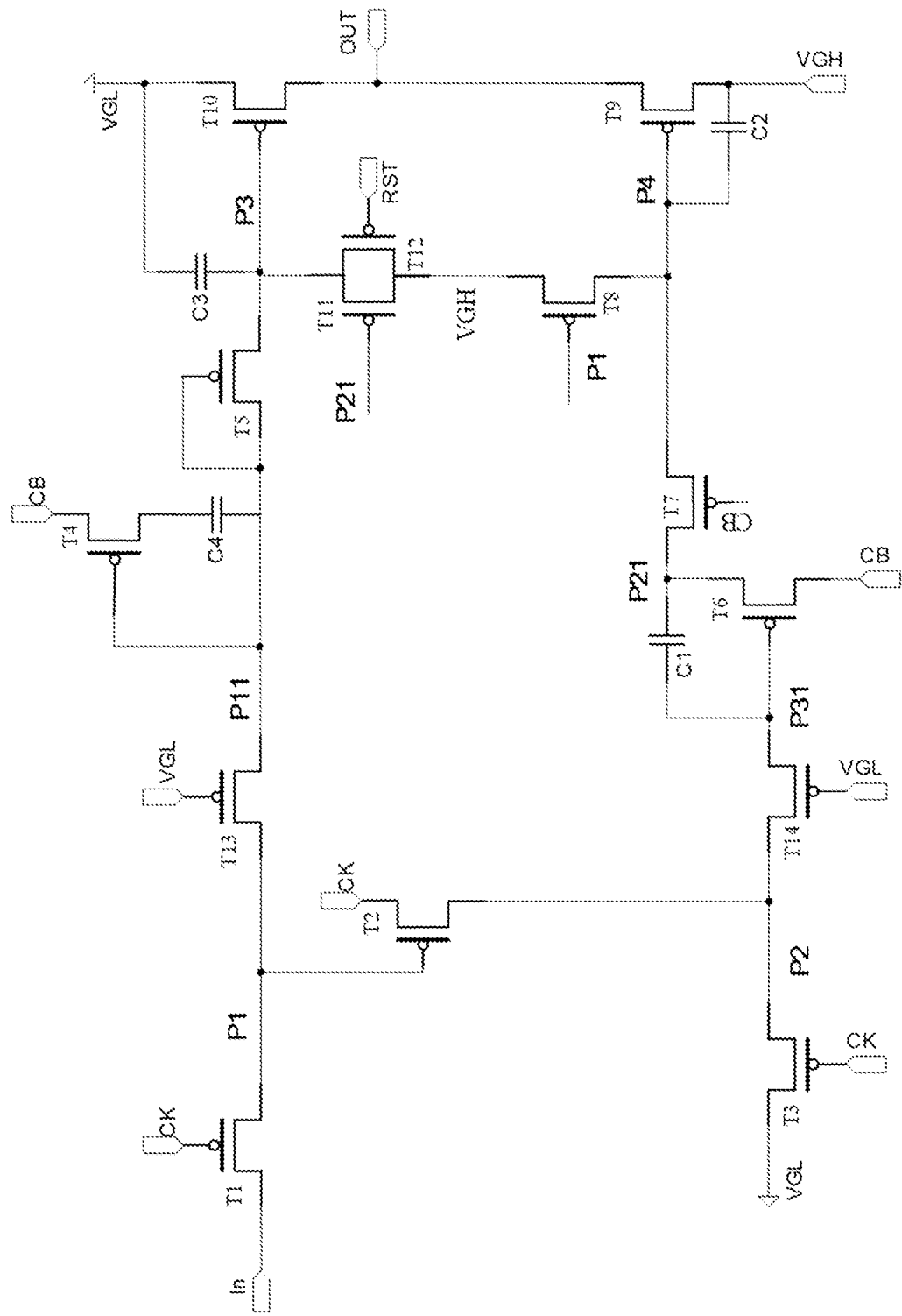
FIG. 9 is a circuit diagram of a specific implementation of the shift register unit shown in FIG. 7 in some examples.

For example, in this example, in the blanking stage, in a case where the reset signal is a valid level, the first node P1 is reset, so that the first control circuit 120, the second control circuit 160, and the fourth control circuit 180 are turned off, and the transistor T2, the transistor T4, the transistor T5, and the transistor T8 (as shown in FIG. 9) included in the first control circuit 120, the second control circuit 160, and the fourth control circuit 180 are restored in a short time, and therefore, the state of the shift register unit can be further stabilized and the service life of the circuit can be prolonged.

Those skilled in the art can understand that although a plurality of control circuits and a plurality of reset circuits are shown in FIG. 1-FIG. 8, the above examples do not limit the protection scope of the present disclosure. In practical applications, the skilled person can choose to use or not use one or more of the above circuits according to the situation, and the various combinations and modifications of the above circuits do not deviate from the principles of the present disclosure, and are not repeated here.

In a case where the shift register unit shown in FIG. 7 does not include the sixth sub-circuit 163, FIG. 9 is a circuit diagram of a specific implementation of the shift register unit shown in FIG. 7 in some examples. In some embodiments of the present disclosure, the shift register unit 10 shown in FIG. 7 may be implemented as the circuit structure shown in FIG. 9. As shown in FIG. 9, the shift register unit 10 includes: an input transistor MI to a tenth control transistor M14, a third control capacitor C1, an output capacitor C2, an output noise reduction capacitor C3 and a first control capacitor C4. It should be noted that the transistors shown in FIG. 9 are all described by taking P-type transistors as an example, which is not limited in the embodiments of the present disclosure. For example, at least some of the transistors in the shift register unit 10 may also be N-type transistors.

Figure 10:
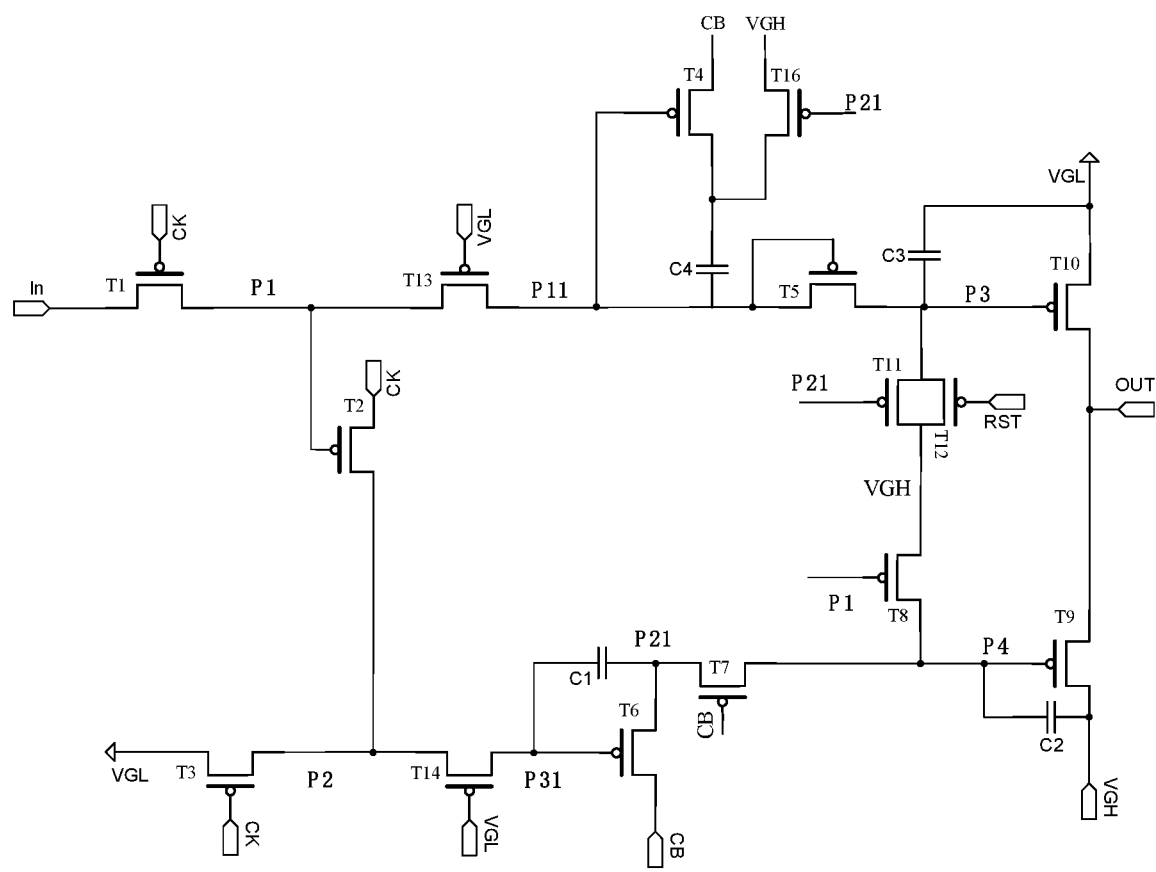
FIG. 10 is a circuit diagram of a specific implementation of the shift register unit shown in FIG. 7 in other examples.

In a case where the shift register unit shown in FIG. 7 includes the sixth sub-circuit 163, FIG. 10 is a circuit diagram of a specific implementation of the shift register unit shown in FIG. 7 in other examples. That is, on the basis of the example shown in FIG. 9, the fourth control transistor T16 is further included. The specific implementation of the shift register unit shown in FIG. 7 is described in detail below with reference to FIG. 9 and FIG. 10.

For example, as shown in FIG. 9, the input circuit 110 includes an input transistor T1. A gate electrode of the input transistor T1 is connected to the first clock signal terminal CK to receive the first clock signal, a first electrode of the input transistor T1 is connected to the input terminal IN to receive the input signal, and a second electrode of the input transistor T1 is connected to the first node P1.

For example, in other embodiments, the gate electrode and the first electrode of the input transistor T1 may also be both connected to the input terminal IN to receive the input signal, so that the input signal is input to the first node P1 in a case where the input transistor T1 is turned on in response to the input signal.

For example, as shown in FIG. 9, the reset circuit 150 includes a reset transistor T12. A gate electrode of the reset transistor T12 is connected to the total reset terminal RST to receive the total reset signal, a first electrode of the reset transistor T12 is connected to the first voltage terminal VGH to receive the first voltage, and a second electrode of the reset transistor T12 is connected to the third node P3.

For example, the output noise reduction circuit 130 includes an output noise reduction transistor T10. A gate electrode of the output noise reduction transistor T10 is connected to the third node P3, a first electrode of the output noise reduction transistor T10 is connected to the second voltage terminal VGL to receive the second voltage, and the second electrode of the output noise reduction transistor T10 is connected to the output terminal OUT.

For example, the output noise reduction circuit 130 further includes an output noise reduction capacitor C3. A first electrode of the output noise reduction capacitor C3 is connected to the second voltage terminal VGL to receive the second voltage, and the second electrode of the output noise reduction capacitor C3 is connected to the third node P3.

Figure 14:
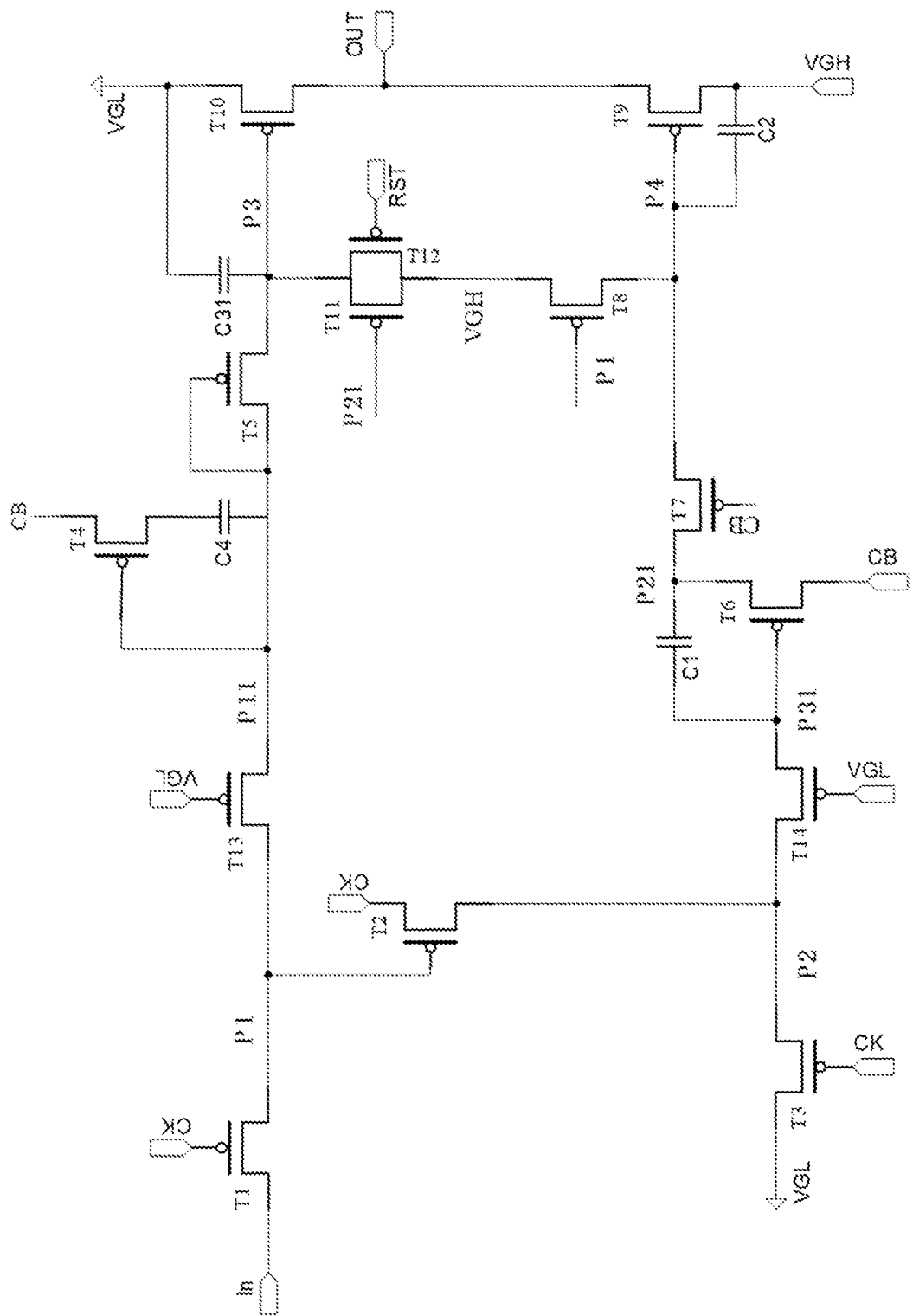
FIG. 14 is a circuit diagram of a specific implementation of the shift register unit shown in FIG. 7 in other examples.

For example, in some examples, the output noise reduction circuit 130 may also not include the output noise reduction capacitor C3. As shown in FIG. 14, the parasitic capacitance C31 of the output noise reduction transistor T10 is taken as the output noise reduction capacitor C3. Because the size of the output noise reduction transistor T10 is relatively large, and the parasitic capacitance C31 of the output noise reduction transistor T10 is also relatively large, the parasitic capacitance C31 can act as the output noise reduction capacitor C3. For example, the capacitance value of the parasitic capacitor C31 is less than or equal to the capacitance value of the output noise reduction capacitor. The reduction of the capacitance value of the output noise reduction circuit 130 can improve the reset speed, the reset speed of the third node P3 can also be increased, and the fluctuation margin of the threshold voltage Vth of the output noise reduction transistor T10 can be increased, which is beneficial to prolong the service life of the shift register unit. Further, the occupied area and size of the shift register unit can be reduced, which is beneficial to the narrow frame.

For example, as shown in FIG. 9, the output circuit 140 includes an output transistor T9 and an output capacitor C2. For example, a gate electrode of the output transistor T9 is connected to the fourth node P4, a first electrode of the output transistor T9 is connected to the output terminal OUT, and the second electrode of the output transistor T9 is connected to the first voltage terminal VGH to receive the first voltage. The first electrode of the output capacitor C2 is connected to the fourth node P4, and the second electrode of the output capacitor C2 is connected to the first voltage terminal VGH is connected to receive the first voltage.

For example, as shown in FIG. 9, the first sub-circuit 161 includes a first control transistor T4, a second control transistor T5, and a first control capacitor C4. A gate electrode of the first control transistor T4 is connected to the first control node P11, a first electrode of the first control transistor T4 is connected to the second clock signal terminal CB to receive the second clock signal, and a second electrode of the first control transistor T4 is connected to a first electrode of the first control capacitor C4. A second electrode of the first control capacitor C4 is connected to the first control node P11. A gate electrode and a first electrode of the second control transistor T5 are connected to each other, and both are connected to the first control node P11, and a second electrode of the second control transistor T5 is connected to the third node P3.

For example, the second sub-circuit 162 includes a third control transistor T13. A gate electrode of the third control transistor T13 is connected to the second voltage terminal VGL, a first electrode of the third control transistor T13 is connected to the first node P1, and a second electrode of the third control transistor T13 is connected to the first control node P11.

For example, as shown in FIG. 10, the sixth sub-circuit 163 includes a fourth control transistor T16. A gate electrode of the fourth control transistor T16 is connected to the second control node P21, a first electrode of the fourth control transistor T16 is connected to the first voltage terminal VGH to receive the first voltage, and a second electrode of the fourth control transistor T16 is connected to the first electrode of the first control capacitor C4, so that in a case where the second control node P21 is at a valid level, the voltage of the first electrode of the first control capacitor C4 can be stabilized at the first voltage, and when the level of the second clock signal provided by the second clock signal terminal CB connected to the first control transistor T4 jumps, it is avoided that the level of the first control node P11 jumps with the jump of the second clock signal caused by the charge conservation principle of the first control capacitor C4, thus preventing the second clock signal terminal CB from influencing the level of the first control node P11, further affecting the leakage of the output noise reduction transistor T10, and reducing the noise when outputting a high level.

For example, as shown in FIG. 9, the first control circuit 120 includes a sixth control transistor T2 and a seventh control transistor T3. A gate electrode of the sixth control transistor T2 is connected to the first node P1, a first electrode of the sixth control transistor T2 is connected to the first clock signal terminal CK to receive the first clock signal, and a second electrode of the sixth control transistor T2 is connected to the second node P2. A gate electrode of the seventh control transistor T3 is connected to the first clock signal terminal CK to receive the first clock signal, a first electrode of the seventh control transistor T3 is connected to the second voltage terminal VGL to receive a second voltage, and a second electrode of the seventh control transistor T3 is connected to the second node P2.

Figure 11:
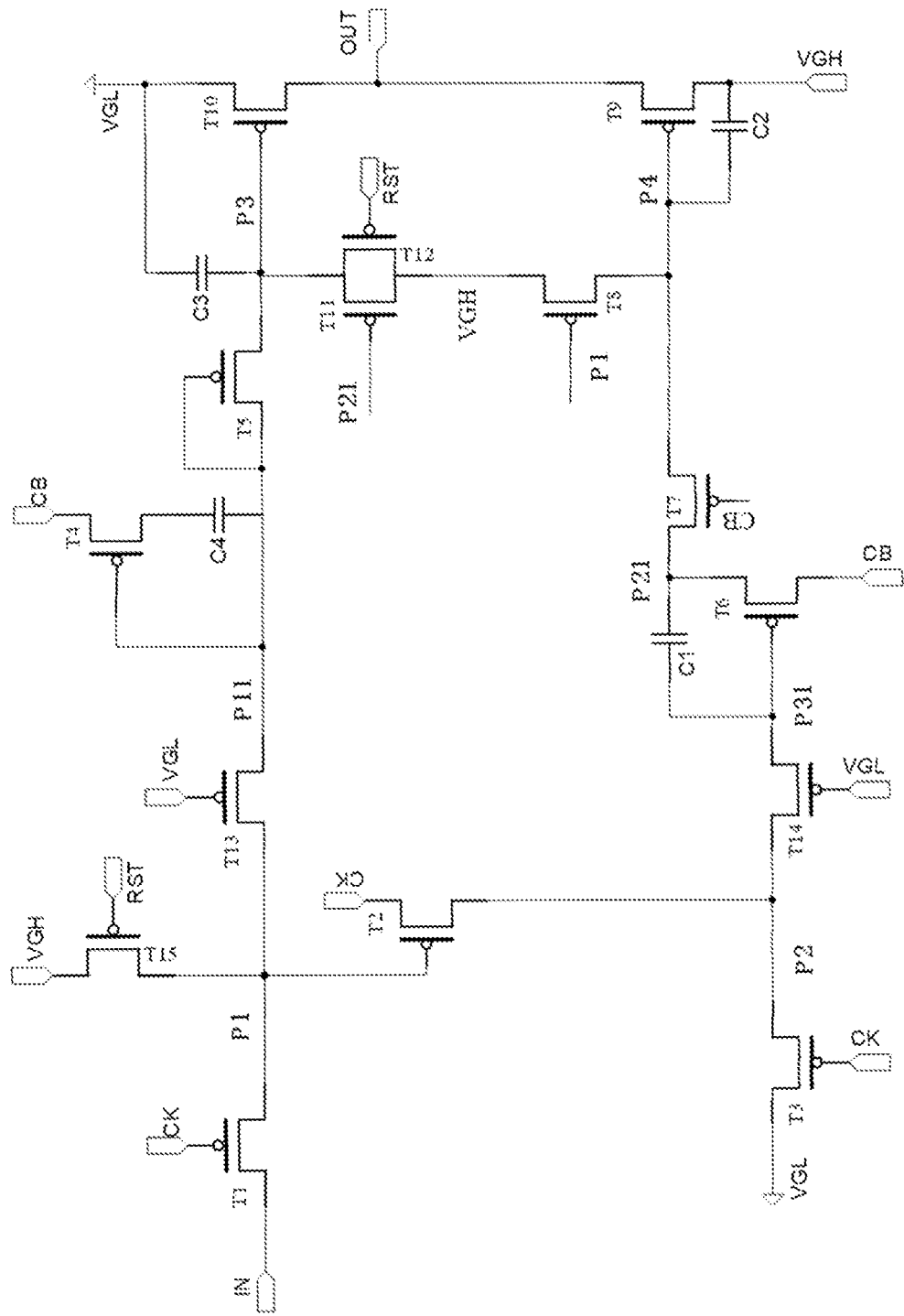
FIG. 11 is a circuit diagram of a specific implementation of the shift register unit shown in FIG. 8 in some examples.

For example, as shown in FIG. 9-FIG. 11, the third sub-circuit 171 includes an eighth control transistor T6 and a third control capacitor C1, the fourth sub-circuit includes a ninth control transistor T7, and the fifth sub-circuit includes a tenth control transistor T14. A gate electrode of the tenth control transistor T14 is connected to the second voltage terminal VGL to receive the second voltage, a first electrode of the tenth control transistor T14 is connected to the second node P2, and a second electrode of the tenth control transistor T14 is connected to the third control node P31. A first electrode of the third control capacitor C1 is connected to the third control node P31, and a second electrode of the third control capacitor C1 is connected to the second control node P21. A gate electrode of the eighth control transistor T6 is connected to the third control node P31, a first electrode of the eighth control transistor T6 is connected to the second clock signal terminal CB to receive the second clock signal, and a second electrode of the eighth control transistor T6 is connected to the second control node P21. A gate electrode of the ninth control transistor T7 is connected to the second clock signal terminal CB to receive the second clock signal, a first electrode of the ninth control transistor T7 is connected to the second control node P2, and a second electrode of the ninth control transistor T9 is connected to the fourth node P4.

For example, the third control transistor T13 can reduce the leakage of the first control node P11, and the tenth control transistor T14 can reduce the leakage of the third control node P31, so that the response speed of the gate driving signal output is faster.

For example, the fourth control circuit 180) includes an eleventh control transistor T8. A gate electrode of the eleventh control transistor T8 is connected to the first node P1, a first electrode of the eleventh control transistor T8 is connected to the fourth node P4, and the second electrode of the eleventh control transistor T8 is connected to the first voltage terminal VGH to receive the first voltage.

For example, the fifth control circuit 190 includes a twelfth control transistor T11. A gate electrode of the twelfth control transistor T11 is connected to the second control node P21, a first electrode of the twelfth control transistor T11 is connected to the third node P3, and a second electrode of the twelfth control transistor T11 is connected to the first voltage terminal VGH to receive a first voltage.

FIG. 11 is a circuit diagram of a specific implementation of the shift register unit shown in FIG. 8 in some examples. In some embodiments of the present disclosure, the shift register unit 10 shown in FIG. 8 may be implemented as the circuit structure shown in FIG. 11. As shown in FIG. 11, based on the example shown in FIG. 9, the shift register unit 10 further includes a fifth control transistor T15. It should be noted that the circuit structure shown in FIG. 11 is basically the same as the circuit structure shown in FIG. 9, and the specific introduction may refer to the introduction in FIG. 9, which is not repeated here.

For example, as shown in FIG. 11, the sixth control circuit 200 includes a fifth control transistor T15. A gate electrode of the fifth control transistor T15 is connected to the total reset terminal RST to receive the total reset signal, a first electrode of the fifth control transistor T15 is connected to the first voltage terminal VGH to receive the first voltage, and a second electrode of the fifth control transistor T15 is connected to the first node P1.

Figure 12:
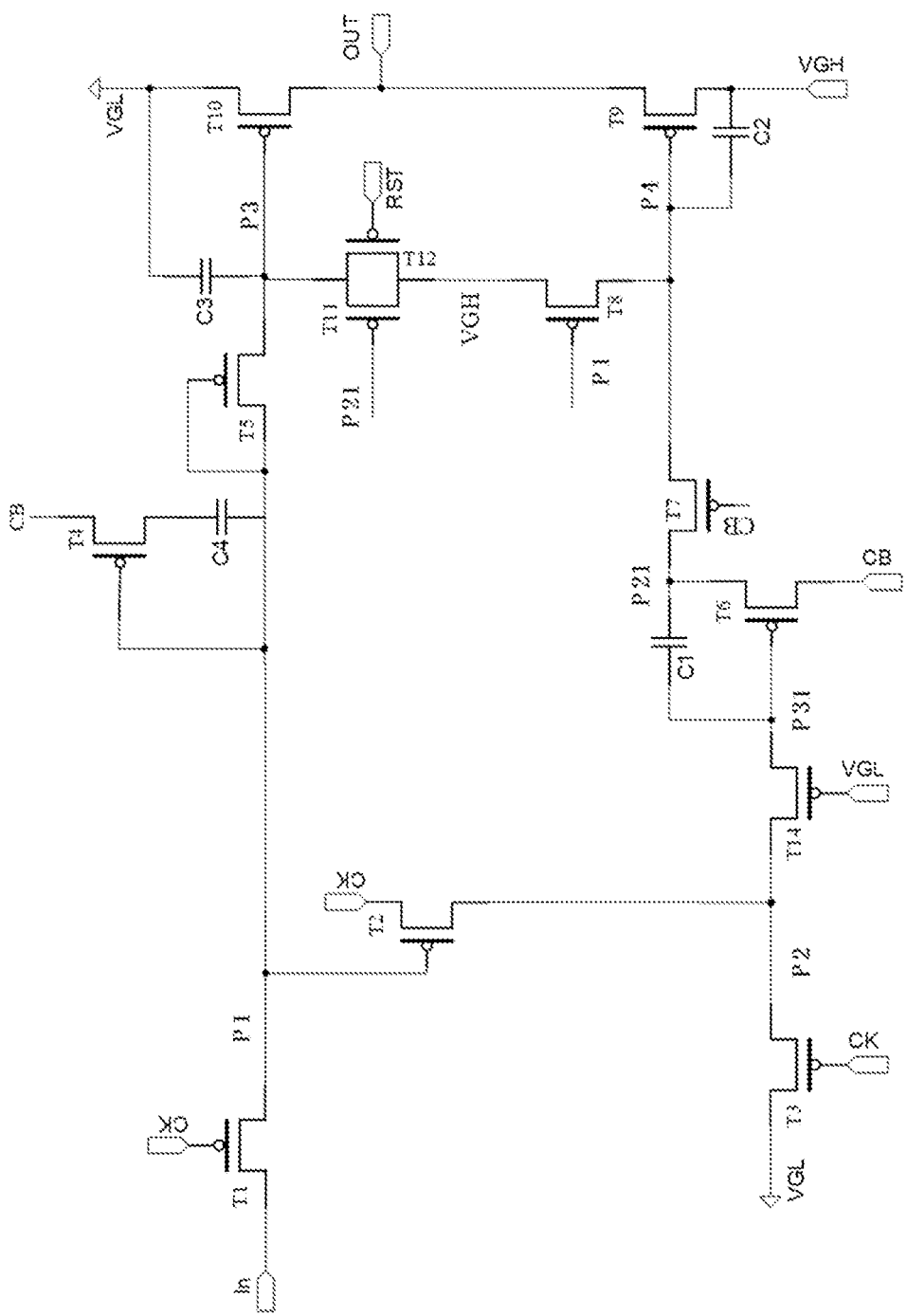
FIG. 12 is a circuit diagram of a specific implementation of the shift register unit shown in FIG. 2 in some examples.

FIG. 12 is a circuit diagram of a specific implementation of the shift register unit shown in FIG. 2 in some examples. In some embodiments of the present disclosure, the shift register unit 10 shown in FIG. 2 may be implemented as the circuit structure shown in FIG. 12. As shown in FIG. 12, on the basis of the example shown in FIG. 9, the second control circuit 160 of the shift register unit 10 only includes the first sub-circuit, that is, on the basis of the example shown in FIG. 9, the third control transistor T13 is not included. It should be noted that the circuit structure shown in FIG. 12 is basically the same as the circuit structure shown in FIG. 9, and the specific description can refer to the introduction in FIG. 9, which is not repeated here.

Figure 13:
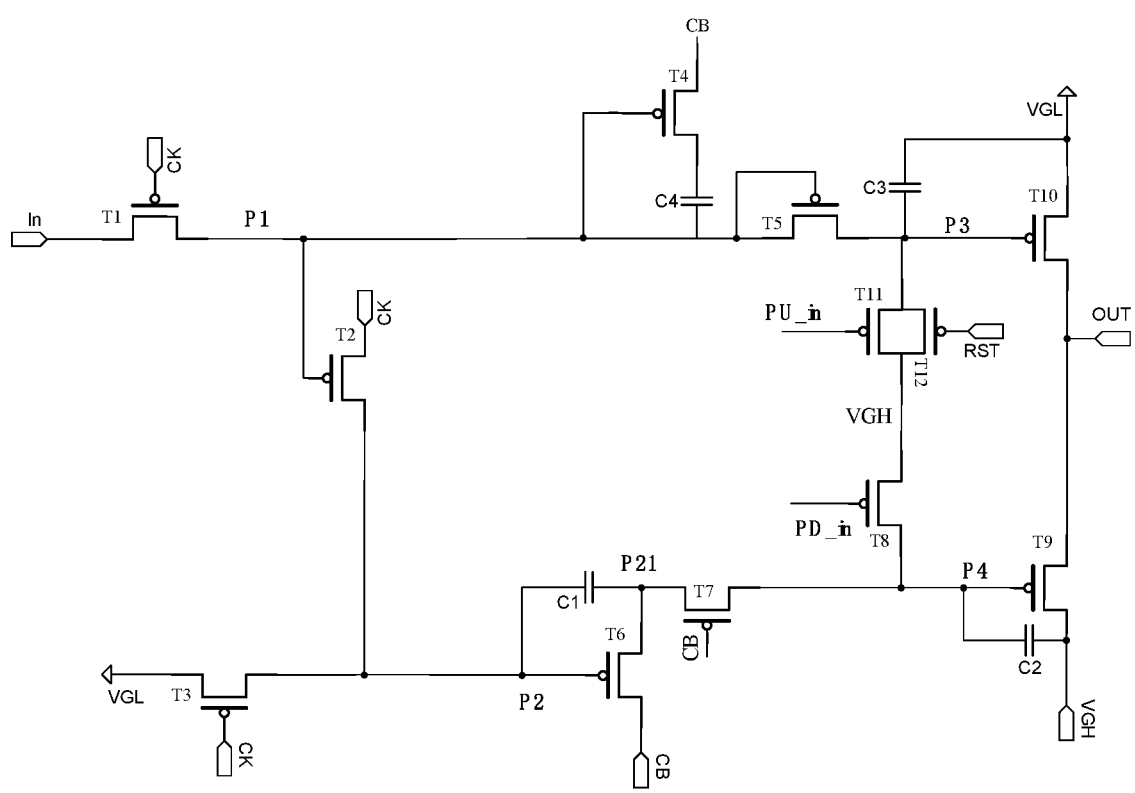
FIG. 13 is a circuit diagram of a specific implementation of the shift register unit shown in FIG. 5 in a case where the second sub-circuit and the sixth sub-circuit are not included in the shift register unit.

FIG. 13 is a circuit diagram of a specific implementation of the shift register unit shown in FIG. 5 in a case where the second sub-circuit and the sixth sub-circuit are not included. In some embodiments of the present disclosure, the shift register unit 10 shown in FIG. 5 may be implemented as the circuit structure shown in FIG. 13 in a case where the second sub-circuit and the sixth sub-circuit are not included. As shown in FIG. 13, based on the example shown in FIG. 9, the second control circuit 160 of the shift register unit 10 only includes the first sub-circuit, and the third control circuit 170 only includes the third sub-circuit and the fourth sub-circuit, that is, on the basis of the example shown in FIG. 9, the third control transistor T13 and the tenth control transistor T14 are not included. In this example, not only does not affect the function of the shift register unit, but also facilitates the realization of narrow frame. It should be noted that the circuit structure shown in FIG. 13 is basically the same as the circuit structure shown in FIG. 9, and the specific description can refer to the introduction in FIG. 9, which is not repeated here.

As mentioned above, in the shift register unit 10 provided by the embodiments of the present disclosure, the third control capacitor C1 may be used to maintain the potential of the second control node P21, the output capacitor C2 may be used to maintain the potential of the fourth node P4, the output noise reduction capacitor C3 or the parasitic capacitor C31 is used to maintain the potential of the third node P3, and the first control capacitor C4 is used to maintain the potential at the first control node P11. The third control capacitor C1, the output capacitor C2, the output noise reduction capacitor C3, and the first control capacitor C4 may be capacitor components prepared by technological process. For example, a capacitor component may be implemented by preparing special capacitor electrodes, and each electrode of the capacitor may be implemented by a metal layer, a semiconductor layer (e.g., doped polysilicon), etc., or in some examples, the third control capacitor C1, the output capacitor C2, the output noise reduction capacitor C3, and the first control capacitor C4 may also be realized by parasitic capacitance between various devices by designing circuit wiring parameters. The connection methods of the third control capacitor C1, the output capacitor C2, the output noise reduction capacitor C3 and the first control capacitor C4 are not limited to the methods described above, and may also be other suitable connection methods, as long as the levels written to the second control node P21, the fourth node P4, the third node P3 and the first control node P11 can be stored.

It should be noted that, in some embodiments of the present disclosure. VGH represents both the first voltage terminal and the first voltage, and VGL represents both the second voltage terminal and the second voltage. The first voltage VGH is, for example, a high level, and the second voltage VGL is, for example, a low level. For example, the first voltage VGH is greater than the second voltage VGL, and the following embodiments use the same representation and are not repeated.

In addition, it should be noted that, in some embodiments of the present disclosure, the high level and the low level are relative terms. The high level represents a higher voltage range (for example, the high level may be 5V. 10V or other suitable voltages), and a plurality of high levels may be the same or different. Similarly, a low level represents a lower voltage range (e.g., a low level may be 0V, −5V, −10V. or other suitable voltages), and a plurality of low levels may be the same or different. For example, the minimum value of a high level is greater than the maximum value of a low level.

It should be noted that, in some embodiments of the present disclosure, controlling the level of a node (for example, the first node P1, etc.) includes charging the node to pull up the level of the node, or discharging the node to pull down the level of the node. For example, a capacitor (e.g., the above-mentioned capacitors C1-C4) may be provided that is electrically connected to the node, and charging the node represents charging the capacitor electrically connected to the node; similarly, discharging the node represents discharging the capacitor electrically connected to the node. Therefore, the high level or low level of the node may be maintained through the capacitor.

It should be noted that CK represents both the first clock signal terminal and the first clock signal, and CB represents the second clock signal terminal and the second clock signal. The following embodiments use the same representations and are not repeated.

In the embodiments of the present disclosure, for example, in a case where each circuit is implemented as an N-type transistor, the term "pull up" represents charging a node or an electrode of a transistor, so as to raise the absolute value of the level of the node or the electrode to achieve the operation (such as turning on) of the corresponding transistor; and the term "pull down" represents discharging a node or an electrode of a transistor, so as to reduce the absolute value of the level of the node or the electrode to achieve the operation (such as turning off) of the corresponding transistor.

For another example, in a case where each circuit is implemented as an P-type transistor, the term "pull up" represents discharging a node or an electrode of a transistor, so as to reduce the absolute value of the level of the node or the electrode to achieve the operation (such as turning on) of the corresponding transistor; and the term "pull down" represents charging a node or an electrode of a transistor, so as to raise the absolute value of the level of the node or the electrode to achieve the operation (such as turning off) of the corresponding transistor.

It should be noted that, in the description of the various embodiments of the present disclosure, the first node P1, the second node P2, the third node P3, the fourth node P4, the first control node P11, the second control node P21 and the third control node P31 do not represent actual components, but represent the junction of the relevant electrical connections in the circuit diagram.

The transistors used in the embodiments of the present disclosure may all be thin film transistors, field effect transistors, or other switching components with the same characteristics, and the thin film transistors are used as examples for description in the embodiments of the present disclosure. The source electrode and drain electrode of the transistor used here may be symmetrical in structure, so the source electrode and drain electrode of the transistor may be indistinguishable in structure. In the embodiments of the present disclosure, in order to distinguish the two electrodes of the transistor except the gate electrode, it is directly described that one electrode is the first electrode and the other electrode is the second electrode. In addition, transistors may be divided into N-type and P-type transistors according to their characteristics. When is a P-type transistor, the turning on voltage is a low-level voltage (e.g., 0V, −5V, −10V. or other suitable voltages), and the turning off voltage is a high-level voltage (e.g., 5V, 10V, or other suitable voltages). When the transistor is an N-type transistor, the turning on voltage is a high-level voltage (e.g., 5V, 10V, or other suitable voltages), and the turning off voltage is a low-level voltage (e.g., 0V, −5V, −10V or other suitable voltages).

In addition, the transistors in the embodiments of the present disclosure are all described by taking a P-type transistor as an example. In this case, the first electrode of the transistor is the drain electrode, and the second electrode is the source electrode. It should be noted that the present disclosure includes but is not limited to this. For example, one or more transistors in the shift register unit 10 provided by the embodiments of the present disclosure may also adopt N-type transistors. In this case, the first electrode of the transistor is the source electrode, and the second electrode is the drain electrode. It only needs that the electrodes of the transistors of the selected type are connected accordingly with reference to the electrodes of the corresponding transistors in the embodiments of the present disclosure and make the corresponding voltage terminals provide the corresponding high level or low level. In a case where an N-type transistor is used, compared to the use of Low Temperature Poly Silicon (LTPS) or amorphous silicon (such as hydrogenated non-crystalline silicon) as the valid layer of the thin film transistor. Indium Gallium Zinc Oxide (IGZO) may be used as the valid layer of the thin film transistor and can effectively reduce the size of the transistor and prevent leakage current.

Figure 15A:
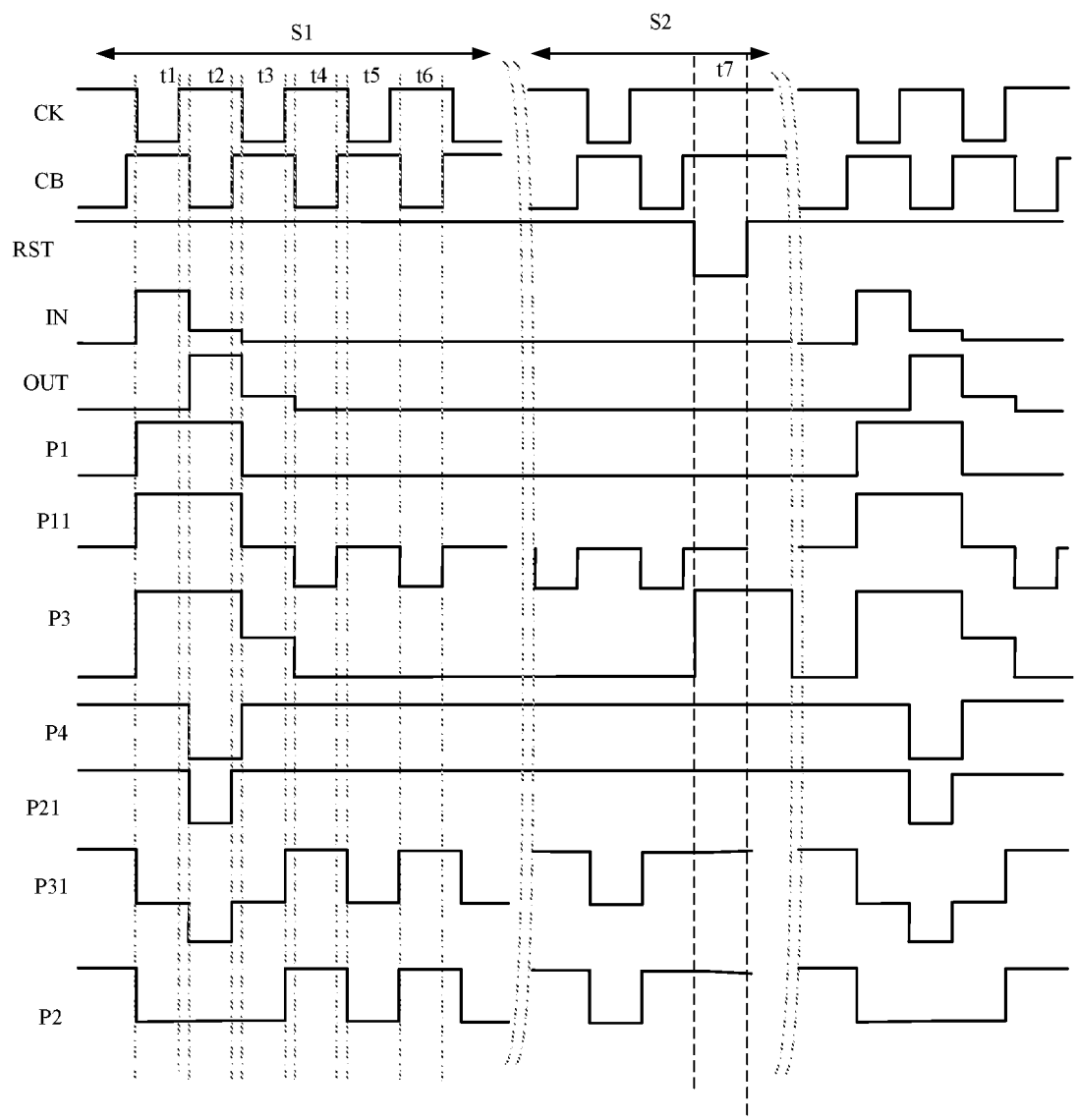
FIG. 15A shows a signal timing diagram when the shift register unit 10 shown in FIG. 14 operates.

At least one embodiment of the present disclosure further provides a driving method for a shift register unit. FIG. 15A shows a signal timing diagram when the shift register unit 10 shown in FIG. 14 operates.

For example, as shown in FIG. 15A, the driving method includes a first operation stage S1 and a second operation stage S2. In the first operation stage S1, the driving method includes a first sub-stage t1, a second sub-stage t2, and a third sub-stage t3. A frame includes a first operation stage S1 (i.e., the display stage) and a second operation stage S2 (i.e., the blanking stage), the display stage is used to drive the display panel to display, and the blanking stage is a stage between the display stage of the current frame and the display stage of the next frame. The signal levels in the signal timing diagram shown in FIG. 15A are only schematic and do not represent actual level values.

In the first sub-stage t1, controlling the level of the first node P1 by the input circuit 110 in response to valid level of the input signal input from the input terminal IN; and controlling the level of the second node P2 by the first control circuit 120 under control of the level of the first node P1 and the first clock signal provided by the first clock signal terminal CK.

In the second sub-stage t2, outputting an output signal at the output terminal OUT by the output circuit 140 under control of the level of the second node P2.

In the third sub-stage t3, reducing noise at the output terminal OUT by the output noise reduction circuit 130 under control of the level of the first node P1.

In some other examples, the driving method further includes a fourth sub-stage t4, a fifth sub-stage t5 and a sixth sub-stage t6.

The working methods of the shift register unit 10 provided by at least one embodiment of the present disclosure are described in detail below with reference to FIG. 15A and FIG. 14. For example, the first sub-stage t1 is the input stage t1, the second sub-stage t2 is the output stage t2, the third sub-stage t3 is the reset stage t3, the fourth sub-stage t4 is the first holding stage t4, and the fifth sub-stage t5 is the second holding stage t5, and the sixth sub-phase t6 is the third holding stage t6. In the first operation stage S1, the total reset signal terminal RST provides a high level, and the reset transistor T12 is turned off in response to the high level of the total reset signal.

In the input stage t1, the first clock signal terminal CK provides a low level, the second clock signal terminal CB provides a high level, the input terminal IN provides a high level, the input transistor T1 is turned on in response to the low level of the first clock signal, the third control transistor T13 is turned on in response to the second voltage provided by the second voltage terminal VGL, the potential of the first node P1 is at a high level, the potential of the first control node P11 is at a high level, and the first control transistor T4 and the second control transistor T5 are both turned off in response to the high level of the first control node P11. The sixth control transistor T2 is turned off in response to the high level of the first node P1, the seventh control transistor T3 is turned on in response to the low level of the first clock signal, and the tenth control transistor T14 is turned on in response to the second voltage provided by the second voltage terminal VGL. The potential of the second node P2 is at a low level, and the potential of the third control node P31 is at a low level. The eighth control transistor T6 is turned on in response to the low level of the third control node P31. The potential of the second control node P21 is at a high level, the ninth control transistor T7 is turned off in response to the high level of the second clock signal, the eleventh control transistor T8 is turned off in response to the high level of the first node, and the twelfth control transistor T11 is turned off in response to the high level of the second control node P21. The potential of the third node P3 is maintained at a high level, and the potential of the fourth node P4 is maintained at a high level, the output noise reduction transistor T10 is turned off in response to the high level of the third node, the ninth transistor T9 is turned off in response to the low level of the fourth node P4, and the output terminal OUT outputs a low level.

In the output stage t2, the first clock signal terminal CK provides a high level, the second clock signal terminal CB provides a low level, the input terminal IN provides a low level, the input transistor T1 is turned off, the third control transistor T13 is turned on, and the potential of the first node P1 and the potential of the first control node P11 are maintained at a high level. The first control transistor T4 is turned off, the second control transistor T5 is turned off, the sixth control transistor T2 and the seventh control transistor T3 are turned off, the potential of the second node P2 is maintained at a low level, the eighth control transistor T6 is turned on the low level provided by the second clock signal terminal CB is input to the second control node P21, and the second control node P21 changes from a high level to a low level. According to the charge conservation principle of the third control capacitor C1, the potential of the third control node P31 is further pulled down by the third control capacitor C1, the ninth control transistor T7 is turned on, the eleventh control transistor T8 is turned off, the twelfth control transistor T11 is turned on in response to the low level of the second control node P21, the potential of the fourth node P4 is at a low level, and the potential of the third node P3 is still at a high level. Therefore, the ninth transistor T9 is turned on the output noise reduction transistor T10 is turned off, and the output terminal OUT outputs the high level provided by the first voltage terminal VGH.

In the reset phase t3, the first clock signal terminal CK provides a low level, the second clock signal terminal CB provides a high level, the input terminal IN provides a low level, the input transistor T1 is turned on the potential of the first node P1 is pulled down, the third control transistor T13 is turned on the potential of the first control node P11 is pulled down, the second control transistor T5 is turned on, and the potential of the third node P3 is pulled down. The output noise reduction transistor T10 is turned on in response to the level of the third node P3, the second voltage provided by the second voltage terminal VGL is output to the output terminal OUT, and the output terminal OUT outputs a low level, so as to achieve the noise reduction at the output terminal OUT. The sixth control transistor T2 and the seventh control transistor T3 are turned on, the potential of the second node P2 is at a low level, the tenth control transistor T14 is turned on, the eighth control transistor T6 is turned on the second control node P21 becomes the high level provided by the second clock signal terminal CB, the potential of the third control node P3 is pulled up according to the charge conservation principle of the third control capacitor, and the ninth control transistor T7 is turned off. The eleventh control transistor T8 is turned on in response to the low level of the first node, the potential of the fourth node P4 is pulled high, and the ninth transistor T9 is turned off.

In the first holding stage t4 included in the holding phase, the first clock signal terminal CK provides a high level, the second clock signal terminal CB provides a low level, the input terminal IN provides a low level, and the input transistor T1 is turned off, the potential of the first node P1 is maintained at a low level, the third control transistor T13 is turned on, the first control transistor T4 is turned on the second clock signal terminal CB pulls down the potential of the first control node P11 by the first control capacitor C4, and the second control transistor T5 is turned on, so that the potential of the third node P3 is maintained lower than VGL+Vth, and Vth is the threshold voltage of the output noise reduction transistor T10, so that the output noise reduction transistor T10 is turned on, and the potential of the gate driving signal output by the output terminal OUT is maintained at the second voltage, that is, at a low level, and not affected by noise interference. The seventh control transistor T3 is turned off, the sixth control transistor T2 is turned on, and the potential of the second node P2 is the high level provided by the first clock signal terminal CK. The tenth control transistor T14 is turned on the potential of the third control node P31 is at a high level, the potential of the second control node P21 is at a high level, the ninth control transistor T7 is turned on the eight control transistor T8 is turned on the potential of the fourth node P4 is at a high level, and the ninth transistor T9 is turned off.

In the second holding stage t5 included in the holding phase, the first clock signal terminal CK provides a low level, the second clock signal terminal CB provides a high level, the input terminal IN provides a low level, the input transistor T1 is turned on the potential of the first node P1 is at a low level, the third control transistor T13 is turned on the first control node P11 is at a low level, the first control transistor T4 is turned on in response to the low level of the first control node P11, and the potential of the input clock signal provided by the second clock signal terminal CB increases. According to the charge conservation principle of the first control capacitor C4, the potential of the first control node P11 is pulled up, the second control transistor T5 is turned off, and potential of the third node P3 is not affected, so that the potential of the third node P3 is maintained lower than VGL+Vth, and Vth is the threshold voltage of the output noise reduction transistor T10, so that the output noise reduction transistor T10 is turned on, and the potential of the gate driving signal output by the output terminal OUT is maintained at the second voltage, that is, at a low level, and not affected by noise interference. The seventh control transistor T3 is turned on, the potential of the second node P2 is at a low level, the sixth control transistor T2 is turned on, and the tenth control transistor T14 is turned on the potential of the third control node P31 is at a low level, the eighth control transistor T6 is turned on the potential of the second control node P21 is at a high level, the ninth control transistor T7 is turned off, the eleventh control transistor T8 is turned off, the potential of the fourth node is maintained at a high level, and the ninth transistor T9 is turned off.

In the third holding stage t6 included in the holding phase, the first clock signal terminal CK provides a high level, the second clock signal terminal CB provides a low level, the input terminal IN provides a low level, and the input transistor T1 is turned off, the potential of the first node P1 is maintained at a low level, the first control transistor T4 is turned on the second clock signal terminal CB pulls down the potential of the first control node P1 by the first control capacitor C4, and the second control transistor T5 is turned on, so that the potential of the third node P3 is maintained lower than VGL+Vth, and Vth is the threshold voltage of the output noise reduction transistor T10, so that the output noise reduction transistor T10 is turned on, and the potential of the gate driving signal output by the output terminal OUT is maintained at the second voltage, that is, at a low level, and not affected by noise interference. The seventh control transistor T3 is turned off, the sixth control transistor T2 is turned on the potential of the second node P2 is at a high level, the tenth control transistor T14 is turned on, the potential of the third control node P31 is at a high level, the eighth control transistor T6 is turned off, the potential of the second control node P21 is at a high level, the ninth control transistor T7 is turned on the eleventh control transistor T8 is turned on, the potential of the fourth node P4 is a high level, and the ninth transistor T9 is turned off.

In the holding phase, the potential of the third node P3 is maintained lower than VGL+Vth. and Vth is the threshold voltage of the output noise reduction transistor T10, so that the output noise reduction transistor T10 is turned on, and the potential of the gate driving signal output by the output terminal OUT is maintained at the second voltage, and not affected by noise interference.

In the shift register unit shown in FIG. 9-FIG. 14, the first control transistor T4, the first control capacitor C4, and the second control transistor T5 form a charge pump structure. The charge pump is a structure similar to a water pump in a circuit, and mainly achieves the redistribution of the charges and the purpose of boosting (or lowering) by the capacitor, the clock signal, and the diode rectification structure (in FIG. 9-FIG. 14, the second control transistor T5 adopts the diode connection).

For example, as shown in FIG. 15A, in the second operation stage S2, the driving method of the shift register unit includes at least one reset stage t7. Only one reset stage t7 is shown in FIG. 15A, which is not limited by embodiments of the present disclosure.

For example, in at least one reset stage t7, the valid level (e.g., a low level) of the total reset signal is applied to the total reset terminal RST, and the invalid level (for example, a high level) of the first clock signal is applied to the first clock signal terminal CLK. The reset circuit 150 turns off the output noise reduction circuit 130 in response to the valid level of the total reset signal. It should be noted that the "at least one period of valid level in a second operation stage" represents that the second operation stage S2 includes at least one reset stage 17, for example, referring to FIG. 15A, the length of each period of valid level in the second operation stage is the length of one reset stage t7.

For example, in a case where the shift register unit 10 further includes the second control circuit 160, the second control circuit 160 is connected to the first node P1, the third node P3 and the second clock signal terminal CB, and is configured to control the level of the third node P3 under control of the level of the first node P1 and the second clock signal provided by the second clock signal terminal CB. The output noise reduction circuit 130 is further connected to the third node P3, and is configured to output the invalid level of the output signal at the output terminal OUT in response to the level of the third node P3. The reset stage t7 further includes: applying the invalid level of the second clock signal to the second clock signal terminal CB, and resetting the third node P3 by the reset circuit 150 in response to the valid level of the total reset signal, so that the output noise reduction circuit 130 is turned off in response to the level of the third node P3.

As shown in FIG. 15A, in the reset stage t7, the first clock signal terminal CK provides a high level, the second clock signal terminal CB provides a high level, the input terminal IN provides a low level, the total reset terminal RST provides a low level, the input transistor T1 is turned off, the potential of the first node P1 is maintained at a low level, the third control transistor T13 is turned on the first control node P11 is at a low level, the first control transistor T4 is turned on in response to the low level of the first control node P11, and the potential of the second clock signal provided by the second clock signal terminal CB increases. According to the charge conservation principle of the first control capacitor C4, the potential of the first control node P11 is pulled up, and the second control transistor T5 is turned off. Because the reset transistor T12 is turned on in response to the low level of the total reset signal, the first voltage terminal VGH is connected to the third node P3, thereby pulling up the voltage of the third node P3, and turning off the output noise reduction transistor T10, so that the output noise reduction transistor T10 is turned off, and the output noise reduction transistor T10 is turned off in at least one reset phase 17 of the second operation phase S2, and therefore, it can be avoided that the output noise reduction transistor T10 is always turned on in the second operation stage S2, thus avoiding affecting the output reset and noise reduction capability of the output noise reduction circuit 130, thus prolonging the service life of the shift register unit and improving the display quality of the display panel. At this stage, the sixth control transistor T2 is turned on, and the seventh control transistor T3 is turned off, so that the second node P2 is connected to the first clock signal terminal CK, the potential of the second node P2 is the high level provided by the first clock signal terminal CK, the tenth control transistor T14 is turned on, the potential of the third control node P31 is at a high level, the eighth control transistor T6 is turned off, the potential of the second control node P21 is maintained at a high level, the ninth control transistor T7 is turned off, the eleventh control transistor T8 is turned off, the potential of the fourth node P4 is maintained at a high level, and the ninth transistor T9 is turned off.

It should be noted that the driving method of other circuits (for example, the circuits shown in FIG. 9-FIG. 10 and FIG. 12-FIG. 13) is similar to the driving method of the circuit shown in FIG. 14, and the descriptions of the driving methods in FIGS. 14 and 15A may be referred to, which are not repeated here.

Figure 15B:
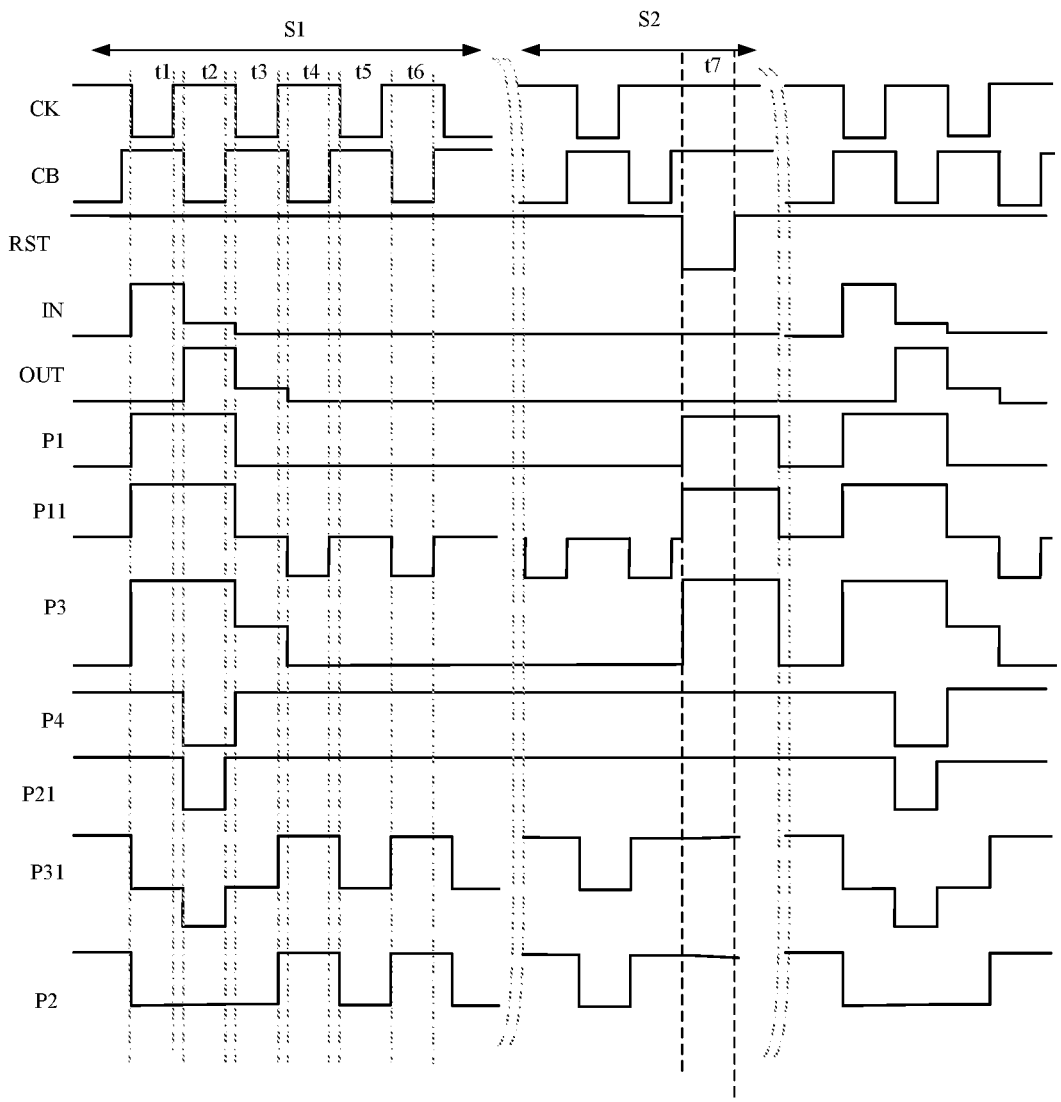
FIG. 15B shows a signal timing diagram when the shift register unit 10 shown in FIG. 11 operates.

FIG. 15B shows a signal timing diagram when the shift register unit 10 shown in FIG. 11 operates. Referring to FIG. 15B, the working process of the shift register unit shown in FIG. 11 is similar to that of the shift register unit shown in FIG. 14, and the only difference is that: in the reset stage t7, the fifth control transistor T15 is turned on in response to the high level of the reset signal, so that the first node P1 is connected to the first voltage terminal VGH, and therefore the level of the first node P1 is a high level. Because the third control transistor T13 is turned on the first control node P11 is connected to the first node P1, so that the level of the first control node P11 is a high level. The rest of the process MAY be referred to the introduction in FIG. 15A, which will not be repeated here.

Figure 16:
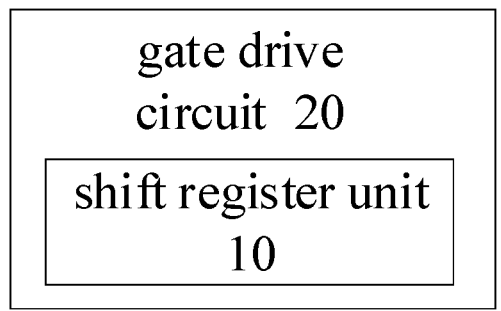
FIG. 16 is a schematic diagram of a gate drive circuit provided by at least one embodiment of the present disclosure.

At least one embodiment of the present disclosure further provides a gate drive circuit 20. As shown in FIG. 16, the gate drive circuit 20 includes a plurality of shift register units 10 that are cascaded, and any one or more shift register unit 10 may adopt the structure of the shift register unit 10 provided by any embodiment of the present disclosure or a modification thereof.

Figure 17:
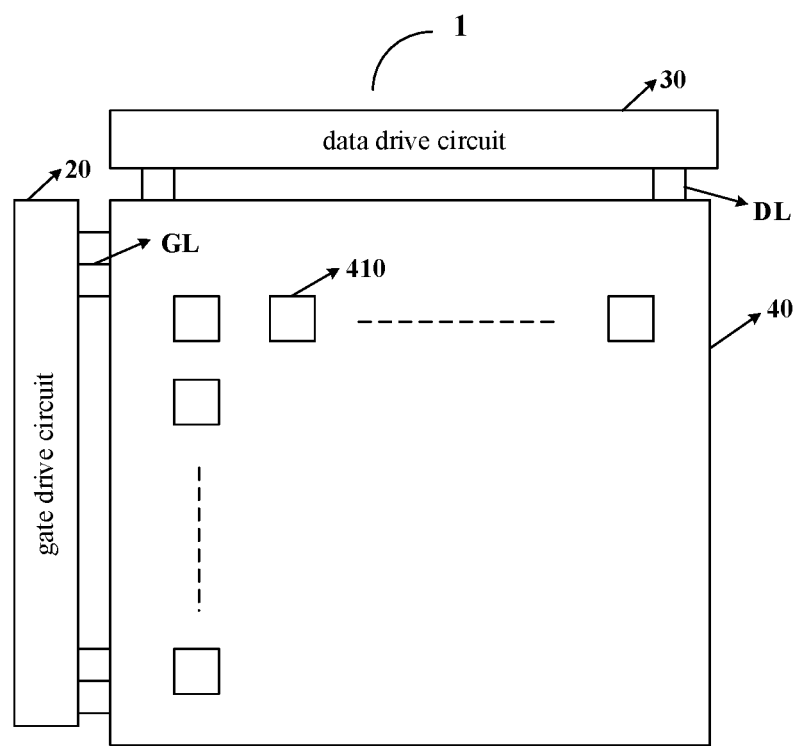
FIG. 17 is a schematic diagram of a display device provided by at least one embodiment of the present disclosure.

At least one embodiment of the present disclosure further provides a display device 1. As shown in FIG. 17, the display device 1 includes a gate drive circuit 20 provided by the embodiments of the present disclosure and a plurality of sub-pixel units 410 arranged in an array. For example, the display device 1 further includes a display panel 40, and a pixel array formed by a plurality of sub-pixel units 410 is provided in the display panel 40.

The output terminal OUT of each shift register unit 10 in the gate drive circuit 20 is electrically connected to the sub-pixel units 410 in each row: For example, the gate drive circuit 20 is electrically connected to the sub-pixel units 410 through gate lines GL. The gate drive circuit 20 is used to provide driving signals to the pixel array, and for example, the driving signal can drive scan transistors and sensing transistors in the sub-pixel units 410.

For example, the display device 1 may further include a data drive circuit 30. The data drive circuit 30 is configured to provide data signals to the pixel array. For example, the data drive circuit 30 is electrically connected to the sub-pixel units 410 through the data lines DL.

It should be noted that the display device 1 in this embodiment may be any product or component with display function, such as: a liquid crystal panel, a liquid crystal TV, a display, an OLED panel, an OLED TV, an electronic paper display device, a mobile phone, a tablet computer, a notebook computer, a digital photo frame, a navigation.

For the technical effect of the display device 1 provided by the embodiments of the present disclosure, reference may be made to the corresponding description of the gate drive circuit 20 in the above-mentioned embodiments, and details are not repeated here.

For this disclosure, the following points need to be explained:

(1) The drawings of the embodiments of the present disclosure only relate to the structures related to the embodiments of the present disclosure, and other structures can refer to the general design.

(2) For clarity, in the drawings used to describe embodiments of the present invention, the thickness and size of layers or structures are exaggerated. It can be understood that when an element such as a layer, film, region or substrate is said to be located "above" or "below" another element, the element may be located "directly" above or below another element, or there may be intervening elements.

(3) Without conflict, the embodiments of the present disclosure and the features in the embodiments can be combined with each other to obtain a new embodiment.

The above is only the specific implementation of the present disclosure, but the scope of protection of the present disclosure is not limited to this. The scope of protection of the present disclosure should be based on the scope of protection of the said claims.

What is claimed is:

1. A shift register unit, comprising:
an input circuit, a first control circuit, an output circuit, an output noise reduction circuit, and a reset circuit;
wherein the input circuit is connected to an input terminal and is configured to control a level of a first node in response to an input signal input from the input terminal;
the first control circuit is connected to the first node, a second node, and a first clock signal terminal, and is configured to control a level of the second node under control of the level of the first node and a first clock signal provided by the first clock signal terminal;
the output circuit is connected to an output terminal and is configured to output an output signal from the output terminal under control of the level of the second node;
the output noise reduction circuit is connected to the output terminal and is configured to reduce noise at the output terminal under control of the level of the first node; and
the reset circuit is directly connected to a total reset terminal, a third node, and a first voltage terminal and is configured to turn off the output noise reduction circuit in response to a total reset signal provided by the total reset terminal, wherein the total reset signal is an invalid level in a first operation stage, and the total reset signal comprises at least one period of valid level in a second operation stage,
the output noise reduction circuit is further directly connected to the third node and is configured to output an invalid level of the output signal at the output terminal in response to the level of the third node;
wherein the shift register unit further comprises a sixth control circuit,
wherein the sixth control circuit is connected to the total reset terminal, the first voltage terminal, and the first node, and the sixth control circuit is configured to reset the first node under control of the total reset signal provided by the total reset terminal.

2. The shift register unit according to claim 1, further comprising a second control circuit,
wherein the second control circuit is connected to the first node, the third node, and a second clock signal terminal, and is configured to control a level of the third node under control of the level of the first node and a second clock signal provided by the second clock signal terminal.

3. The shift register unit according to claim 2, wherein the reset circuit is further connected to the third node and is configured to reset the third node in response to the total reset signal provided by the total rest signal terminal to turn off the output noise reduction circuit.

4. The shift register unit according to claim 2, wherein the second control circuit comprises a first sub-circuit; and
the first sub-circuit is connected to the first node, the second clock signal terminal, and the third node, and the first sub-circuit is configured to control the level of the third node under control of the level of the first node.

5. The shift register unit according to claim 2, further comprising a third control circuit,
wherein the third control circuit is connected to the second node, a fourth node, and the second clock signal terminal, and is configured to control a level of the fourth node under control of the level of the second node and the second clock signal provided by the second clock signal terminal.

6. The shift register unit according to claim 5, wherein the third control circuit comprises a third sub-circuit and a fourth sub-circuit;
the third sub-circuit is connected to the second clock signal terminal and a second control node, and the third sub-circuit is configured to control a level of the second control node under control of the level of the second node; and
the fourth sub-circuit is connected to the second clock signal terminal, the second control node, and the fourth node, and the fourth sub-circuit is configured to control the level of the fourth node in response to the second clock signal provided by the second clock signal terminal.

7. The shift register according to claim 6 wherein the second control circuit further comprises a first sub-circuit, a second sub-circuit, and a sixth sub-circuit; and
the first sub-circuit is connected to the first node, the second clock signal terminal, and the third node, and the first sub-circuit is configured to control the level of the third node under control of the level of the first node;
the second sub-circuit is connected to a second voltage terminal, the first node, and a first control node, and the second sub-circuit is configured to control a level of the first control node in response to a second voltage provided by the second voltage terminal;

the first sub-circuit is further connected to the first control node and is configured to control the level of the third node in response to the level of the first control node; and the sixth sub-circuit is connected to the second control node, the first voltage terminal, and the first sub-circuit, and the sixth sub-circuit is configured to control a level of the first control node to remain stable in response to the level of the second control node.

8. The shift register according to claim 7, further comprising a fourth control circuit and a fifth control circuit, wherein the fourth control circuit is connected to the first node, the first voltage terminal, and the fourth node, and the fourth control circuit is configured to control the level of the fourth node in response to the level of the first node, and the fifth control circuit is connected to the second control node, the third node, and the first voltage terminal, and the fifth control circuit is configured to control the level of the third node in response to the level of the second control node.

9. The shift register unit according to claim 3, wherein the reset circuit comprises a reset transistor; and a gate electrode of the reset transistor is connected to the total reset terminal to receive the total reset signal, a first electrode of the reset transistor is connected to the first voltage terminal to receive a first voltage, and a second electrode of the reset transistor is connected to the third node.

10. The shift register unit according to claim 3, wherein the output noise reduction circuit comprises an output noise reduction transistor; and a gate electrode of the output noise reduction transistor is connected to the third node, a first electrode of the output noise reduction transistor is connected to a second voltage terminal to receive a second voltage, and a second electrode of the output noise reduction transistor is connected to the output terminal.

11. The shift register unit according to claim 7, wherein the first sub-circuit comprises a first control transistor, a second control transistor, and a first control capacitor;

a gate electrode of the first control transistor is connected to the first control node, a first electrode of the first control transistor is connected to the second clock signal terminal to receive the second clock signal, and a second electrode of the first control transistor is connected to a first electrode of the first control capacitor;

a second electrode of the first control capacitor is connected to the first control node; and a gate electrode and a first electrode of the second control transistor are connected to each other, and both are connected to the first control node, and a second electrode of the second control transistor is connected to the third node.

12. The shift register unit according to claim 1, wherein the sixth control circuit comprises a fifth control transistor; and a gate electrode of the fifth control transistor is connected to the total reset terminal to receive the total reset signal, a first electrode of the fifth control transistor is connected to the first voltage terminal to receive a first voltage, and a second electrode of the fifth control transistor is connected to the first node.

13. The shift register unit according to claim 1, wherein the first control circuit comprises a sixth control transistor and a seventh control transistor;

a gate electrode of the sixth control transistor is connected to the first node, a first electrode of the sixth control transistor is connected to the first clock signal terminal to receive the first clock signal, and a second electrode of the sixth control transistor is connected to the second node; and a gate electrode of the seventh control transistor is connected to the first clock signal terminal to receive the first clock signal, a first electrode of the seventh control transistor is connected to a second voltage terminal to receive a second voltage, and a second electrode of the seventh control transistor is connected to the second node.

14. The shift register unit according to claim 7, wherein the third control circuit further comprises a fifth sub-circuit, wherein the fifth sub-circuit is connected to a second voltage terminal, the second node, and a third control node, and is configured to control a level of the third control node in response to a second voltage of the second voltage terminal;

the third sub-circuit is further connected to the third control node and is configured to control the level of the second control node in response to the level of the third control node;

the third sub-circuit comprises an eighth control transistor and a third control capacitor, the fourth sub-circuit comprises a ninth control transistor, and the fifth sub-circuit comprises a tenth control transistor;

a gate electrode of the tenth control transistor is connected to the second voltage terminal to receive the second voltage, a first electrode of the tenth control transistor is connected to the second node, and a second electrode of the tenth control transistor is connected to the third control node;

a first electrode of the third control capacitor is connected to the third control node, and a second electrode of the third control capacitor is connected to the second control node;

a gate electrode of the eighth control transistor is connected to the third control node, a first electrode of the eighth control transistor is connected to the second clock signal terminal to receive the second clock signal, and a second electrode of the eighth control transistor is connected to the second control node; and a gate electrode of the ninth control transistor is connected to the second clock signal terminal to receive the second clock signal, a first electrode of the ninth control transistor is connected to the second control node, and a second electrode of the ninth control transistor is connected to the fourth node.

15. The shift register unit according to claim 8, wherein the fourth control circuit comprises an eleventh control transistor, the fifth control circuit comprises a twelfth control transistor;

a gate electrode of the eleventh control transistor is connected to the first node, a first electrode of the eleventh control transistor is connected to the fourth node, and the second electrode of the eleventh control transistor is connected to the first voltage terminal to receive a first voltage; and a gate electrode of the twelfth control transistor is connected to the second control node, a first electrode of the twelfth control transistor is connected to the third node, and a second electrode of the twelfth control transistor is connected to the first voltage terminal to receive a first voltage.

16. A gate drive circuit, comprising a plurality of shift register units that are cascaded,
wherein each of the plurality of shift register units comprises:
an input circuit, a first control circuit, an output circuit, an output noise reduction circuit, a sixth control circuit, and a reset circuit;
wherein the input circuit is connected to an input terminal and is configured to control a level of a first node in response to an input signal input from the input terminal;
the first control circuit is connected to the first node, a second node, and a first clock signal terminal, and is configured to control a level of the second node under control of the level of the first node and a first clock signal provided by the first clock signal terminal;
the output circuit is connected to an output terminal and is configured to output an output signal from the output terminal under control of the level of the second node;
the output noise reduction circuit is connected to the output terminal and is configured to reduce noise at the output terminal under control of the level of the first node; and
the reset circuit is directly connected to a total reset terminal, a third node, and a first voltage terminal and is configured to turn off the output noise reduction circuit in response to a total reset signal provided by the total reset terminal, wherein the total reset signal is an invalid level in a first operation stage, and the total reset signal comprises at least one period of valid level in a second operation stage,
the output noise reduction circuit is further directly connected to the third node and is configured to output an invalid level of the output signal at the output terminal in response to the level of the third node;
the sixth control circuit is connected to the total reset terminal, the first voltage terminal, and the first node, and the sixth control circuit is configured to reset the first node under control of the total reset signal provided by the total reset terminal.

17. A display device, comprising the gate drive circuit according to claim 16.

18. A driving method of a shift register unit, comprising a first operation stage and a second operation stage;
wherein the shift register unit comprises an input circuit, a first control circuit, an output circuit, an output noise reduction circuit, a sixth control circuit, and a reset circuit;
wherein the input circuit is connected to an input terminal and is configured to control a level of a first node in response to an input signal input from the input terminal;
the first control circuit is connected to the first node, a second node, and a first clock signal terminal, and is configured to control a level of the second node under control of the level of the first node and a first clock signal provided by the first clock signal terminal;
the output circuit is connected to an output terminal and is configured to output an output signal from the output terminal under control of the level of the second node;
the output noise reduction circuit is connected to the output terminal and is configured to reduce noise at the output terminal under control of the level of the first node; and
the reset circuit is directly connected to a total reset terminal, a third node, and a first voltage terminal and is configured to turn off the output noise reduction circuit in response to a total reset signal provided by the total reset terminal, wherein the total reset signal is an invalid level in a first operation stage, and the total reset signal comprises at least one period of valid level in a second operation stage,
the output noise reduction circuit is further directly connected to the third node and is configured to output an invalid level of the output signal at the output terminal in response to the level of the third node;
the sixth control circuit is connected to the total reset terminal, the first voltage terminal, and the first node, and the sixth control circuit is configured to reset the first node under control of the total reset signal provided by the total reset terminal; and
wherein in the first operation stage, the driving method comprises a first sub-stage, a second sub-stage, and a third sub-stage:
in the first sub-stage, controlling the level of the first node by the input circuit, in response to a valid level of the input signal input from the input terminal;
controlling the level of the second node by the first control circuit, under control of the level of the first node and the first clock signal provided by the first clock signal terminal;
in the second sub-stage, outputting the output signal at the output terminal by the output circuit, under control of the level of the second node;
in the third sub-stage, reducing noise at the output terminal by the output noise reduction circuit, under control of the level of the first node;
in the second operating stage, the driving method comprises at least one reset stage;
in the at least one reset stage, applying the valid level of the total reset signal to the total reset terminal, and applying the invalid level of the first clock signal to the first clock signal terminal; and
turning off the output noise reduction circuit by the reset circuit in response to the valid level of the total reset signal.

19. The driving method according to claim 18, wherein in a case where the shift register unit further comprises a second control circuit,
wherein the second control circuit is connected to the first node, the third node, and a second clock signal terminal, and the second control circuit is configured to control a level of the third node under control of the level of the first node and a second clock signal provided by the second clock signal terminal;
the reset stage further comprises:
applying an invalid level of the second clock signal to the second clock signal terminal; and
resetting the third node by the reset circuit in response to the valid level of the total reset signal, to turn off the output noise reduction circuit in response to the level of the third node.

* * * * *